US007442493B2

(12) United States Patent
Sonokawa et al.

(10) Patent No.: US 7,442,493 B2
(45) Date of Patent: Oct. 28, 2008

(54) LITHOGRAPHIC PRINTING METHOD

(75) Inventors: Koji Sonokawa, Shizuoka (JP); Kuniharu Watanabe, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/244,193

(22) Filed: Oct. 6, 2005

(65) Prior Publication Data

US 2006/0075915 A1 Apr. 13, 2006

(30) Foreign Application Priority Data

Oct. 8, 2004 (JP) ............................. 2004-296169
Jul. 22, 2005 (JP) ............................. 2005-212926

(51) Int. Cl.
*G03F 7/00* (2006.01)

(52) U.S. Cl. .................... 430/302; 430/270.1; 430/309; 430/331; 430/434; 430/435; 430/494

(58) Field of Classification Search .............. 430/270.1, 430/302, 309, 331, 434, 435, 494
See application file for complete search history.

(56) References Cited

U.S. PATENT DOCUMENTS

2004/0185371 A1* 9/2004 Takamiya ................ 430/270.1
2005/0175942 A1* 8/2005 Ohnishi ....................... 430/434

FOREIGN PATENT DOCUMENTS

EP 0 985 546 A1 * 3/2000
EP 1 081 554 A1 * 3/2001
EP 1 253 472 A2 10/2002
EP 1 400 856 A2 3/2004
EP 1 457 836 A2 * 9/2004
EP 1 457 837 A2 9/2004
JP 60-129750 A * 7/1985
JP 2938397 B2 6/1999
JP 2001-277740 A 10/2001
JP 2002-29162 A 1/2002
JP 2002254852 A * 9/2002
JP 2004082593 A * 3/2004

OTHER PUBLICATIONS

English language machine translation of JP 2002-254852.*
English language machine translation of JP 2004-082593.*

* cited by examiner

*Primary Examiner*—Amanda C. Walke
(74) *Attorney, Agent, or Firm*—Birch, Stewart, Kolasch & Birch, LLP

(57) ABSTRACT

A printing method comprising: imagewise exposing a lithographic printing plate precursor comprising a support and an image recording layer being removable with a fountain solution or a combination of a printing ink and a fountain solution and loading the exposed lithographic printing plate precursor on a plate cylinder of a printing press, or loading the lithographic printing plate precursor on a plate cylinder of a printing press and imagewise exposing the loaded lithographic printing plate precursor, supplying at least a fountain solution comprising a compound represented by the formula (I) defined herein to the exposed lithographic printing plate precursor so as to remove an unexposed area of the image recording layer; and performing printing.

9 Claims, No Drawings

LITHOGRAPHIC PRINTING METHOD

FIELD OF THE INVENTION

The present invention relates to a printing method for a lithographic printing plate precursor having an image recording layer removable with a printing ink, a fountain solution or both thereof.

BACKGROUND OF THE INVENTION

The lithographic printing is a method of alternately supplying a fountain solution and an oily ink to the surface of a lithographic printing plate having a surface consisting of a lipophilic image part and a hydrophilic non-image part, the hydrophilic non-image part working as a fountain solution-receiving part (ink non-receiving part) and the ink being received only in the lipophilic image part by utilizing the repellency between water and oil from each other, and then transferring the ink to a material on which an image is printed, such as paper, thereby performing printing.

For producing this lithographic printing plate, a lithographic printing plate precursor (PS plate) comprising a hydrophilic support having provided thereon a lipophilic photosensitive resin layer (image recording layer) has been heretofore widely used. Usually, a lithographic printing plate is obtained by a plate-making method where the lithographic printing plate precursor is exposed through an original image such as lith film and while leaving the image recording layer in the portion working out to the image part the other unnecessary image recording layer is dissolved and removed with a developer such as alkaline aqueous solution or organic solvent to expose the hydrophilic support surface and thereby form the non-image part.

In the plate-making process using a conventional lithographic printing plate precursor, a step of dissolving and removing the unnecessary image recording layer with a developer or the like must be provided after exposure and as one problem to be solved, it is demanded to dispense with or simplify such an additive wet processing. In particular, the treatment of waste solutions discharged along with the wet processing is recently a great concern to the entire industry in view of consideration for global environment and the demand for solving the above-described problem is becoming stronger.

As one of simple plate-making methods to cope with such a requirement, a method called on-press development has been proposed, where an image recording layer allowing for removal of the image recording layer of a lithographic printing plate precursor in a normal printing process is used and after exposure, the unnecessary image recording layer is removed on a printing press to obtain a lithographic printing plate.

Specific examples of the on-press development method include a method using a lithographic printing plate precursor having an image recording layer dissolvable or dispersible in a fountain solution, an ink solvent or an emulsified product of fountain solution and ink, a method of mechanically removing the image recording layer by the contact with rollers or a blanket cylinder of a printing press, and a method of weakening the cohesion of the image recording layer or adhesion between the image recording layer and the support by the impregnation of a fountain solution, an ink solvent or the like and then mechanically removing the image recording layer by the contact with rollers or a blanket cylinder.

In the present invention, unless otherwise indicated, the “development processing step” indicates a step where, by using an apparatus (usually an automatic developing machine) except for a printing press, the unnecessary portion of the image recording layer is removed through contact with a liquid (usually an alkaline developer) to expose the hydrophilic support surface, and the “on-press development” indicates a method or step where, by using a printing press, the unnecessary portion of the image recording layer is removed through contact with a liquid (usually a printing ink and/or a fountain solution) to expose the hydrophilic support surface.

On the other hand, a digitization technique of electronically processing, storing and outputting image information by using a computer has been recently widespread and various new image-output systems coping with such a digitization technique have been put into practical use. Along with this, a computer-to-plate (CTP) technique is attracting attention, where digitized image information is carried on a highly converging radiant ray such as laser light and a lithographic printing plate precursor is scan-exposed by this light to directly produce a lithographic printing plate without intervention of a lith film. Accordingly, one of important technical problems to be solved is to obtain a lithographic printing plate precursor suitable for such a technique.

As described above, the demand for a simplified, dry-system and non-processing plate-making work is ever-stronger in recent years from both aspects of consideration for global environment and adaptation for digitization.

To satisfy this requirement, for example, Japanese Patent No. 2,938,397 describes a lithographic printing plate precursor where an image forming layer comprising a hydrophilic binder having dispersed therein hydrophobic thermoplastic polymer particles is provided on a hydrophilic support. In Japanese Patent No. 2,938,397, it is stated that after exposing this lithographic printing plate precursor with an infrared laser to cause coalescence of hydrophobic thermoplastic polymer particles by the effect of heat and thereby form an image and then loading it on a cylinder of a printing press, the lithographic printing plate precursor can be on-press developed with use of a fountain solution and/or an ink. However, in such a method of forming an image through coalescence by mere heat fusion of fine particles, despite good on-press developability, the image strength is low and the press life is not satisfied.

For solving these problems, a technique of improving the press life by utilizing a polymerization reaction has been proposed. For example, JP-A-2001-277740 describes a lithographic printing plate precursor comprising a hydrophilic support having thereon an image recording layer (thermosensitive layer) containing a polymerizable compound-enclosing microcapsule, and JP-A-2002-29162 describes a lithographic printing plate precursor comprising a support having provided thereon an image recording layer (photosensitive layer) containing an infrared absorbent, a radical polymerization initiator and a polymerizable compound.

SUMMARY OF THE INVENTION

However, the conventional on-press development using a fountain solution has a problem that the on-press developability is still insufficient and moreover, since developed/removed components persistently adhere to rollers of a printing press, such as ink roller and water supply roller, a large amount of labor is required for the washing of rollers. An object of the present invention is to provide a lithographic printing method, where in the on-press development of a lithographic printing plate precursor, excellent on-press developability can be ensured and attachment of developed/removed components to a roller of a printing press can be suppressed.

As a result of intensive studies, the present inventors have found that the above-described object can be attained by using a specific fountain solution. That is, the present invention provides the followings .

1. A lithographic printing method comprising the following steps (a) to (c):

(a) imagewise exposing a lithographic printing plate precursor comprising a support having thereon an image recording layer removable with: a fountain solution; or a combination of a printing ink and a fountain solution and then loading it on a plate cylinder of a printing press, or loading the lithographic printing plate precursor on a plate cylinder of a printing press and imagewise exposing it;

(b) supplying at least a fountain solution comprising a compound represented by the following formula (I) to the lithographic printing plate precursor after exposure, thereby removing the unexposed area of the image recording layer; and (c) performing printing:

(I)

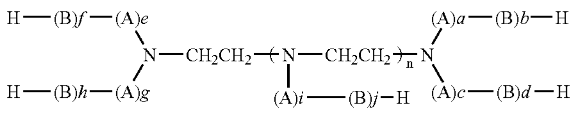

wherein A and B each independently represents $—CH_2CH_2O—$ or $—CH_2CH(CH_3)O—$, and A and B are groups different from each other; a to j each represents an integer of 1 or more, and a to j are values given such that the entire compound has a weight average molecular weight of 500 to 1,500; and n represents an integer of 0 or more.

2. The lithographic printing method as described in 1 above, wherein in formula (I), n is 0.

3. The lithographic printing method as described in 1 above, wherein in formula (I), n is 1.

4. The lithographic printing method as described in any one of 1 to 3 above, wherein in the compound represented by formula (I), the ratio of addition molar numbers of ethylene oxide and propylene oxide is from 5:95 to 50:50.

5. The lithographic printing method as described in any one of 1 to 4 above, wherein the fountain solution is a fountain solution farther comprising at least one member selected from polyvinylpyrrolidone, saccharides and glycerin.

6. The lithographic printing method as described in any one of 1 to 5 above, wherein the fountain solution is a fountain solution comprising substantially no volatile organic solvent.

7. The lithographic printing method as described in any one of 1 to 6 above, wherein the image recording layer comprises (A) an infrared absorbent, (B) a polymerization initiator and (C) a polymerizable compound, and the light source for exposure is an infrared laser.

8. The lithographic printing method as described in 7 above, wherein the image recording layer comprises a microcapsule or a microgel.

9. The lithographic printing method as described in any one of 1 to 6 above, wherein the image recording layer comprises (B) a polymerization initiator and (C) a polymerizable compound and has photosensitivity in the wavelength range of 250 to 420 nm, and the light source for exposure is an ultraviolet laser.

10. The lithographic printing method as described in 9 above, wherein the image recording layer comprises a microcapsule or a microgel.

According to the present invention, a lithographic printing method can be provided, where in the on-press development of a lithographic printing plate precursor, excellent on-press developability can be ensured and attachment of developed/removed components to a roller of a printing press can be suppressed.

DETAILED DESCRIPTION OF THE INVENTION

The lithographic printing method of the present invention and the lithographic printing plate precursor used therefor are described in detail below.

[Lithographic Printing Method]

The lithographic printing method of the present invention is characterized in that after exposing a lithographic printing plate precursor having an image recording layer removable with a fountain solution or a combination of a printing ink and a fountain solution, the unexposed area of the image recording layer is removed on a printing press and the fountain solution used for printing comprises a compound represented by the following formula (I).

(I)

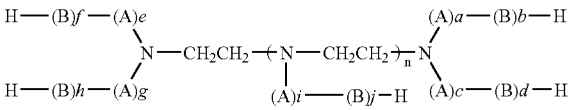

wherein A and B each independently represents $—CH_2CH_2O—$ or $—CH_2CH(CH)O—$, and A and B are groups different from each other; a to j each represents an integer of 1 or more, and a to j are values given such that the entire compound has a weight average molecular weight of 500 to 1,500, and n represents an integer of 0 or more. More preferably, n is 0 or 1. Each copolymerized chain may be a block structure or a random structure but in formula (I), the ratio of addition molar numbers of ethylene oxide and propylene oxide is preferably from 5:95 to 50:50.

The molecular weight of the compound of formula (I) and the ratio between ethylene oxide and propylene oxide can be measured, for example, by the measurement of hydroxyl value and amine value, the NMR measurement or the like.

The amount of the above-described compound added is from 0.01 to 1 weight %, preferably from 0.05 to 0.5 weight %. When this compound is contained, good printing suitability is brought out even without use of an isopropyl alcohol (which is conventionally added at a ratio of about 20 to 30 weight % of water so as to ensure uniform wetting to the non-image part, but from the standpoint of safety of working environment or inhibition of VOC (volatile organic compound) discharge, a technique not using an isopropyl alcohol is demanded to develop). Also, this compound does not invade the image region of the plate even when after application of the fountain solution, a water droplet is caused to remain on the plate by the stopping of printing and concentrated through evaporation of water during standing.

In the fountain solution composition for use in the present invention, a water-soluble polymer compound may be further added.

Specific examples of the water-soluble polymer compound include natural products and modified natural products, such as gum arabic, starch derivatives (e.g., dextrin, enzymolysis dextrin, hydroxypropylated enzymolysis dextrin, carboxymethylated starch, phosphoric acid starch, octenylsuccinated starch), alginate and cellulose derivatives (e.g., carboxymethyl cellulose, carboxyethyl cellulose, hydroxyethyl cellulose, methyl cellulose, hydroxypropylmethyl cellulose, glyoxal-modified product thereof; and synthetic products such as polyvinyl alcohol and derivatives thereof polyvinylpyrrolidone, polyacrylamide and copolymers thereof, polyacrylic acid and copolymers thereof, a vinyl methyl ether/maleic anhydride copolymer, and a vinyl acetate/maleic anhydride copolymer. These polymer compounds can be used individually or in combination of two or more thereof. The amount added thereof is preferably from 0.0001 to 5 weight %, more preferably from 0.003 to 1 weight %, based on the fountain solution.

Among these water-soluble polymer compounds, polyvinylpyrrolidone is preferred in the present invention. The polyvinylpyrrolidone contained in the fountain solution composition means a homopolymer of vinylpyrrolidone. The polyvinylpyrrolidone suitably has a molecular weight of 200 to 3,000,000, preferably from 300 to 500,000, more preferably from 300 to 1,0000, still more preferably from 300 to 30,000.

One of these polyvinylpyrrolidones may be used alone or two or more of polyvinylpyrrolidones differing in the molecular weight may be used in combination. Also, the polyvinylpyrrolidone may be combined with a low molecular-weight polyvinylpyrrolidone, for example, a vinylpyrrolidone oligomer having a polymerization degree of 3 to 5.

As for such a polyvinylpyrrolidone, a commercially available product can be used. For example, polyvinylpyrrolidones of various grades, such as K-15, K-30, K-60, K-90, K-120 produced by ISP, can be used.

The polyvinylpyrrolidone content in the fountain solution is suitably from 0.001 to 0.3 weight %, preferably from 0.005 to 0.2 weight %.

The fountain solution composition for use in the present invention preferably contains at least one member selected from the group consisting of saccharides and glycerin. The saccharide can be selected from monosaccharides, disaccharides, oligosaccharides and the like, and a sugar alcohol obtained by hydrogenation is also included in the saccharides. Specific examples thereof include D-erythrose, D-threose, D-arabinose, D-ribose, D-xylose, D-erythro-pentulose, D-allose, D-galactose, D-glucose, D-mannose, D-talose, β-D-fructose, α-L-sorbose, 6-deoxy-D-glucose, D-glycero-D-galactoheptose, α-D-allo-heptulose, β-D-altro-3-heptulose, saccharose, lactose, D-maltose, isomaltose, inulobiose, hyalbiouronic acid, maltotriose, D,L-arabitol, ribitol, xylitol, D,L-sorbitol, D,L-mannitol, D,L-iditol, D,L-talitol, dulcitol, allodulcitol, maltitol and reduced starch syrup. One of these saccharides may be used alone, or two or more thereof may be used in combination.

Also, glycerin may be used alone or in combination with a saccharide.

In the fountain solution, the content of the at least one member selected from the group consisting of saccharides and glycerin is suitably from 0.01 to 1 weight %, preferably from 0.05 to 0.5 weight %.

In general, the fountain solution is preferably used in the acidic region, that is, at a pH in the vicinity of 3 to 6. If the pH is less than 3, the etching effect on the support is strong and the press life decreases. In order to adjust the pH value to the region of 3 to 6, this may be generally attained by adding an organic acid and/or an inorganic acid or a salt thereof. Preferred examples of the organic acid include a citric acid, an ascorbic acid, a malic acid, a tartaric acid, a lactic acid, an acetic acid, a glycolic acid, a gluconic acid, an acetic acid, a hydroxyacetic acid, an oxalic acid, a malonic acid, a levulinic acid, a sulfanilic acid, a p-toluenesulfonic acid, a phytic acid and an organic phosphonic acid. Examples of the inorganic acid include a phosphoric acid, a nitric acid, a sulfuric acid and a polyphosphoric acid. Furthermore, an alkali metal salt, alkaline earth metal salt ammonium salt or organic amine salt of these organic acids and/or inorganic acids may also be suitably used. These organic acids, inorganic acids and/or salts thereof may be used individually or in combination of two or more thereof.

The fountain solution composition for use in the present invention may also be used in the alkali region at a pH in the vicinity of 7 to 11 by incorporating an alkali metal hydroxide, a phosphoric acid alkali metal salt, an alkali carbonate metal salt, a silicate or the like.

In addition to these components, a chelating compound may also be added to the fountain solution composition for use in the present invention. The fountain solution composition is usually used after diluting a concentrated composition by adding tap water, well water or the like. The tap water or well water used for the dilution contains calcium ion or the like and this sometimes adversely affects the printing to readily cause staining of the printed matter. In such a case, the problem may be overcome by adding a chelating compound. Preferred examples of the chelating compound include aminopoly-carboxylic acids such as ethylenediaminetetraacetic acid and its potassium salt and sodium salt, diethylenetriaminepentaacetic acid and its potassium salt and sodium salt, triethylenetetraminehexaacetic acid and its potassium salt and sodium salt, hydroxyethylethylenediaminetriacetic acid and its potassium salt and sodium salt, nitrilo-triacetic acid and its potassium salt and sodium salt, 1,2-diaminocyclohexanetetraacetic acid and its potassium salt and sodium salt, and 1,4-diamino-2-propanoltetraacetic acid and its potassium salt and sodium salt; and organic phosphonic acids and phosphonoalkanetricarboxylic acids such as 2-phosphonobutanetricarboxylic acid-1,2,4 and its potassium salt and sodium salt, 2-phosphonobutanetricarboxylic acid-2,3,4 and its potassium salt and sodium salt, 1-phosphonoethanetricarboxylic acid-1,2,2 and its potassium salt and sodium salt, 1-hydroxyethane-1,1-diphosphonic acid and its potassium salt and sodium salt, and aminotri(methylenephosphonic acid) and its potassium salt and sodium salt.

In place of the sodium salt or potassium salt chelating agent, an organic amine salt may also be effectively used.

From these, a chelating agent which can be stably present in the fountain solution and does not inhibit the printing property, is selected. The amount added thereof is suitably from 0.001 to 3 weight %, preferably from 0.01 to 1 weight %, based on the fountain solution.

The fountain solution composition for use in the present invention may contain an antiseptic. Specific examples of the antiseptic include benzoic acid and derivatives thereof, phenol and derivatives thereof, formalin, imidazole derivatives, sodium dehydroacetate, 4-isothiazolin-3-one derivatives, benzotriazole derivatives, amidine or guanidine derivatives, quaternary ammonium salts, derivatives of pyridine, quinoline or guanidine, derivatives of diazine or triazole, derivatives of oxazole or oxazine, halogenonitropropane compounds and bromonitroalcohol-based compounds such as bromonitropropanol, 1,1-dibromo-1-nitro-2-ethanol, 3-bromo-3-nitropentane and 2,4-diol. The antiseptic is preferably added in an amount large enough to stably exert the effect against bacteria, fungi, yeast or the like, and the amount added is preferably from 0.0001 to 1.0 weight % based on the fountain solution, though this may vary depending on the kind of the bacteria, fungi or yeast. Also, two or more antiseptics are preferably used in combination so as to exert the effect against various fungi, bacteria or yeast.

The fountain solution composition for use in the present invention may further contain a coloring agent, a rust inhibitor, a defoaming agent and the like. As for the coloring agent, a food dye or the like can be preferably used. Examples thereof include CI Nos. 19140 and 15985 for yellow dye, CI Nos. 16185, 45430, 16255, 45380 and 45100 for red dye, CI No. 42640 for violet dye, CI Nos. 42090 and 73015 for blue dye, and CI No. 42095 for green dye.

Examples of the rust inhibitor include benzotriazole, 5-methylbenzotriazole, thiosalicylic acid, benzimidazole and derivatives thereof.

The defoaming agent is preferably a silicon defoaming agent and either an emulsion-dispersing type or a solubilizing type may be used.

In the fountain solution composition for use in the present invention, for example, a corrosion inhibitor such as magnesium nitrate, zinc nitrate, calcium nitrate, sodium nitrate, potassium nitrate, lithium nitrate and ammonium nitrate, a hardening agent such as chromium compound n aluminum compound, an organic solvent such as cyclic ether (e.g., 4-butyrolactone), and a water-soluble surface-active organic metal compound described in JP-A-61-193893 may be further added each in the range from 0.0001 to 1 weight %.

In the fountain solution composition for use in the present invention, a small amount of a surfactant may be further added. Examples of the anionic surfactant include fatty acid salts, abietates, hydroxyalkanesulfonates, alkanesulfonates, dialkylsulfosuccinates, linear alkylbenzenesulfonates, branched alkylbenzenesulfonates, alkylnaphthalenesulfonates, alkylphenoxypolyoxyethylenepropylsulfonates, polyoxyethylenealkylsulfophenyl ether salts, N-methyl-N-oleyltaurine sodium salts, monoamide disodium N-alkylsulfosuccinates, petroleum sulfonates, hydrogenated castor oil, sulfated beef tallow oil, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene-maleic anhydride copolymerization products, partially saponified olefin-maleic anhydride copolymerization products and naphthalenesulfonate formalin condensates. Among these, preferred are dialkylsulfosuccinates, alkylsulfuric esters and alkylnaphthalenesulfonates.

Examples of the nonionic surfactant include polyoxyalkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid partial esters, sucrose fatty acid partial esters, polyoxyethylene sorbitan fatty acid partial esters, polyoxyethylene sorbitol fatty acid partial esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamines, triethanolamine fatty acid esters and trialkylamine oxides. Among these, preferred are polyoxyethylene alkylphenyl ethers and polyoxyethylene-polyoxypropylene block copolymers.

Examples of the cationic surfactant include alkylamine salts, quaternary ammonium salts, polyoxyethylene alkylamine salts and polyethylene polyamine derivatives. Examples of the amphoteric surfactant include alkylimidazolines. Also, a fluorine-containing surfactant may be used. Examples of the fluorine-containing anionic surfactant include perfluoroalkylsulfonate, perfluoroalkylcarboxylate and perfluoroalkylphosphoric ester; examples of the fluorine-containing nonionic surfactant include perfluoroalkyl ethylene oxide adduct and perfluoroalkyl propylene oxide adduct; and examples of the fluorine-containing cationic surfactant include perfluoroalkyl-trimethylammonium salt.

In view of bubbling, the content of such a surfactant is suitably 10 weight % or less, preferably from 0.01 to 3.0 weight %.

In the fountain solution composition for use in the present invention, glycols and/or alcohols and the like may be contained as the wetting agent. Examples of the wetting agent include ethylene glycol monomethyl ether, diethylene glycol monomethyl ether, triethylene glycol monomethyl ether, tetraethylene glycol monomethyl ether, ethylene glycol monoethyl ether, diethylene glycol monoethyl ether, triethylene glycol monoethyl ether, tetraethylene glycol monoethyl ether, ethylene glycol monopropyl ether, diethylene glycol monopropyl ether, triethylene glycol monopropyl ether, tetraethylene glycol monopropyl ether, ethylene glycol monoisopropyl ether, diethylene glycol monoisopropyl ether, triethylene glycol monoisopropyl ether, tetraethylene glycol monoisopropyl ether, ethylene glycol monobutyl ether, diethylene glycol monobutyl ether, triethylene glycol monobutyl ether, tetraethylene glycol monobutyl ether, ethylene glycol monoisobutyl ether, diethylene glycol monoisobutyl ether, triethylene glycol monoisobutyl ether, tetraethylene glycol monoisobutyl ether, ethylene glycol mono-tert-butyl ether, diethylene glycol mono-tert-butyl ether, triethylene glycol mono-tert-butyl ether, tetraethylene glycol mono-tert-butyl ether, propylene glycol monomethyl ether, dipropylene glycol monomethyl ether, tripropylene glycol monomethyl ether, tetrapropylene glycol monomethyl ether, propylene glycol monoethyl ether, dipropylene glycol monoethyl ether, tripropylene glycol monoethyl ether, tetrapropylene glycol monoethyl ether, propylene glycol monopropyl ether, dipropylene glycol monopropyl ether, tripropylene glycol monopropyl ether, tetrapropylene glycol monopropyl ether, propylene glycol monoisopropyl ether, dipropylene glycol monoisopropyl ether, tripropylene glycol monoisopropyl ether, tetrapropylene glycol monoisopropyl ether, propylene glycol monobutyl ether, dipropylene glycol monobutyl ether, tripropylene glycol monobutyl ether, tetrapropylene glycol monobutyl ether, propylene glycol monoisobutyl ether, dipropylene glycol monoisobutyl ether, tripropylene glycol monoisobutyl ether, tetrapropylene glycol monoisobutyl ether, propylene glycol mono-tert-butyl ether, dipropylene glycol mono-tert-butyl ether, tripropylene glycol mono-tert-butyl ether, tetrapropylene glycol mono-tert-butyl ether, polypropylene glycol having a molecular weight of 200 to 1,000 and its monomethyl ether, monoethyl ether, monopropyl ether, monoisopropyl ether and monobutyl ether, propylene glycol, dipropylene glycol, tripropylene glycol, tetrapropylene glycol pentapropylene glycol, ethylene glycol, diethylene glycol, triethylene glycol, polyethylene glycol, butylene glycol, hexylene glycol, ethyl alcohol, n-propyl alcohol, benzyl alcohol, ethylene glycol monophenyl ether, 2-ethyl-1,3-hexanediol, 3-methoxy-3-methyl-1-butanol, 1-butoxy-2-propanol, diglycerin, polyglycerin, trimethylolpropane, pentaerytritol, methoxyethanol, ethoxyethanol, butoxyethanol and 3-methoxybutanol.

These wetting agents may be used individually or in combination of two or more thereof, and the wetting agent may be contained in an amount of 0.01 to 1 weight % based on the fountain solution.

In the fountain solution composition for use in the present invention, the balance component is water.

The fountain solution composition on the commercial base is generally concentrated and commercialized. Accordingly, the concentrated fountain solution composition can be produced as an aqueous solution by dissolving the above-described respective components in water, preferably desalted water, namely, pure water. Such a concentrated solution is usually diluted on use with tap water, well water or the like to approximately from 10 to 200 times and used as a fountain solution.

In the fountain solution composition for use in the present invention, the organic solvent having volatility may not be used in combination and the isopropyl alcohol may be completely alternated. Accordingly, the fountain solution composition for use in the present invention may be a fountain solution composition substantially not containing a volatile organic solvent. The term "substantially not containing a volatile organic solvent" means that according to the measuring method of ASTM D2369-95, the amount of the volatile organic solvent in the concentrated fountain solution composition is 10 weight % or less.

In the measuring method of ASTM D2369-95, the conditions that 3 ml of a sample is placed in a hot air oven at 110° C. for 1 hour are employed and the amount of the volatile organic solvent is determined according to the following formula:

Formula:

{(weight of sample−weight of heating residue−weight of water in sample)/(weight of sample)}× 100=amount (weight %) of volatile organic solvent Incidentally, even when an isopropyl alcohol is used in combination in an amount of 1 to 15 weight % based on the fountain solution, there arises no problem in the printing quality.

The amount of the fountain solution supplied to the lithographic printing plate precursor varies depending on the specific composition or the like of the fountain solution but is preferably an amount of giving a thickness of 0.1 to 5 μm, more preferably from 0.5 to 3 μm, on the lithographic printing plate precursor.

The fountain solution supplied may be used at an arbitrary temperature but is preferably used at 10 to 50° C.

In the present invention, the lithographic printing plate precursor prepared is imagewise exposed in the step (i). The imagewise exposure is performed by the exposure through a transparent original having a line image, a halftone image or the like or by the scan-exposure with a laser based on digital data. Examples of the light source suitable for the exposure include a carbon arc lamp, a mercury lamp, a xenon lamp, a metal halide lamp, a strobe, an ultraviolet ray, an infrared ray and a laser. In particular, a laser is preferred and examples thereof include a solid or semiconductor laser of emitting infrared ray at 760 to 1,200 nm, and a semiconductor laser of emitting light at 250 to 420 nm.

The exposed lithographic printing plate precursor is loaded on a plate cylinder of a printing press. In the case of a printing press with a laser exposure device, the lithographic printing plate precursor is loaded on a plate cylinder of the printing press and then imagewise exposed.

The fountain solution may be supplied by any means but a continuous water-supply system is preferably used. The continuous water-supply system is known and a commercially available system can be used. Specific examples thereof include a Dahlgren water-supply system, an Epic Delta water-supply system, an Alcolor water-supply system and a Komorimatic water-supply system.

In the present invention, at the same time with the step (b), a printing sheet may be passed while contacting the inking roller with the plate cylinder and contacting the blanket cylinder with the plate cylinder, thereby continuously progressing to the printing in the step (c). That is, the step (b) and the step (c) may be the same step. The printing ink used in the step (c) is a printing ink for normal lithographic printing.

In the present invention, the on-press printing is performed as described above.

The lithographic printing plate precursor for use in the present invention is described below.

[Lithographic Printing Plate Precursor]

The lithographic printing plate precursor for use in the present invention comprises a support having thereon an image recording layer removable with a fountain solution or a combination of a printing ink and a fountain solution. The image recording layer is preferably an image recording layer comprising (A) an infrared absorbent, (B) a polymerization initiator and (C) a polymerizable compound and being capable of image recording with an infrared laser, or an image recording layer comprising (B) a polymerization initiator and (C) a polymerizable compound and having photosensitivity in the wavelength range of 250 to 420 nm.

The constituent components of such a lithographic printing plate precursor are described below.

<(A) Infrared Absorbent>

The infrared absorbent for use in the present invention has a function of converting the absorbed infrared ray into heat and by the effect of heat generated here, the polymerization initiator (radical generator) described later thermally decomposes to generate a radical. The infrared absorbent for use in the present invention is a dye or a pigment having an absorption maximum at a wavelength of 760 to 1,200 nm.

As for the dye, commercially available dyes and known dyes described in publications such as *Senryo Binran* (*Handbook of Dyes*), compiled by Yuki Gosei Kagaku Kyokai (1970) may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, and pyrylium compounds described in JP-B-5-13514 and JP-B-5-19702 may also be preferably used. Other preferred examples of the dye include near infrared absorbing dyes represented by formulae (I) and (II) of U.S. Pat. No. 4,756,993.

Also, other preferred examples of the infrared absorbing dye for use in the present invention include specific indolenine cyanine dyes described in JP-A-2002-278057, which are shown below.

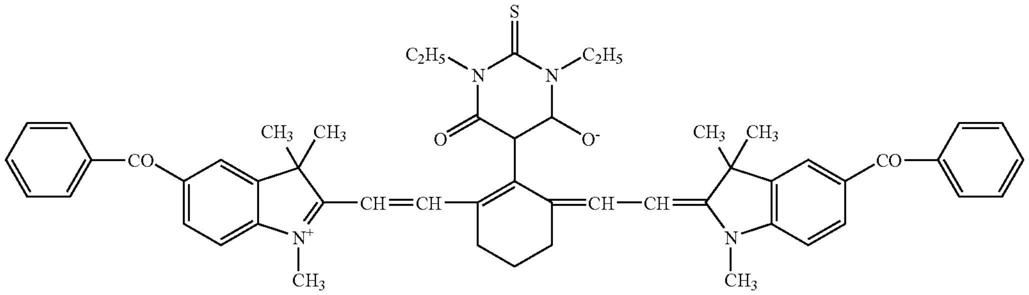

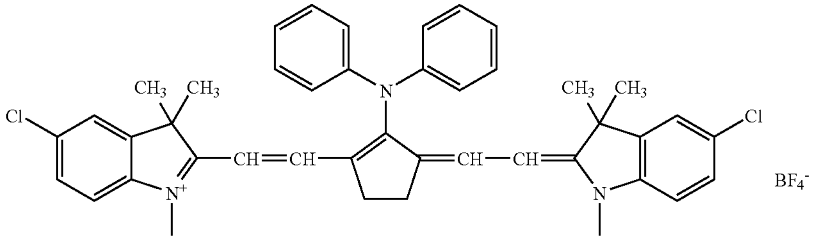

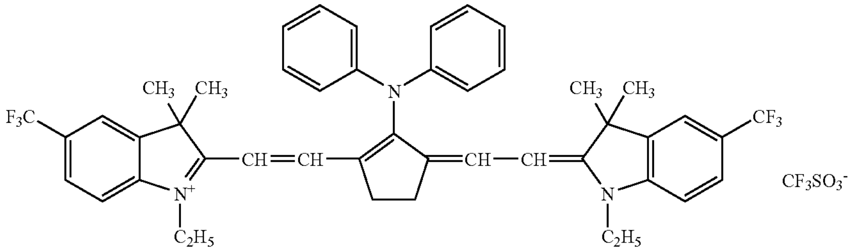

Among these dyes, preferred are a cyanine dye, a squarylium dye, a pyrylium salt, a nickel thiolate complex and an indolenine cyanine dye, more preferred are a cyanine dye and an indolenine cyanine dye, still more preferred is a cyanine dye represented by the following formula (II):

(II)

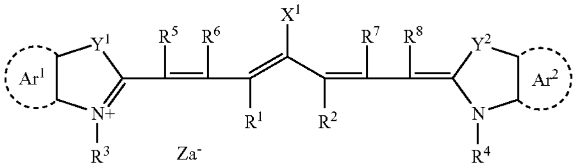

In formula (II), $X^1$ represents a hydrogen atom, a halogen atom, —$NPh_2$, $X^2$-$L^1$ or a group shown below (wherein $X^2$ represents an oxygen atom, a nitrogen atom or a sulfur atom, and $L^1$ represents a hydrocarbon group having from 1 to 12 carbon atoms, an aromatic ring having a heteroatom, or a hydrocarbon group having from 1 to 12 carbon atoms and containing a heteroatom (the heteroatom as used herein indicates N, S, O, a halogen atom or Se)).

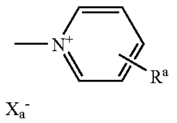

$X_a^-$ has the same definition as $Za^-$ described later, and $R^a$ represents a substituent selected from a hydrogen atom, an alkyl group, an aryl group, a substituted or unsubstituted amino group and a halogen atom.

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms and in view of availability of the raw material, preferably a hydrogen atom. $Za^-$ represents a counter anion, but when the cyanine dye represented by formula (II) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (II), which can be suitably used in the present invention, include those described in paragraphs [0017] to [0019] of JP-A-2001-133969.

Other particularly preferred examples include specific indolenine cyanine dyes described in JP-A-2002-278057 supra.

As for the pigment used in the present invention, commercially available pigments and pigments described in *Color Index* (*C.I.*) *Binran* (*C.I. Handbook*), *Saishin Ganryo Binran* (*Handbook of Latest Pigments*) compiled by Nippon Ganryo Gijutsu Kyokai (1977), *Saishin Ganryo Oyo Gijutsu* (*Latest Pigment Application Technology*), CMC Shuppan (1986), and *Insatsu Ink Gijutsu* (*Printing Ink Technology*), CMC Shuppan (1984) can be used.

The kind of the pigment includes black pigment, yellow pigment, orange pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, a silane coupling agent, an epoxy compound or an isocyanate) to the pigment surface. These surface-treating methods are described in *Kinzoku Sekken no Seishitsu to Oyo* (*Properties and Application of Metal Soap*), Saiwai Shobo, *Insatsu Ink Gijutsu* (*Printing Ink Technology*), CMC Shuppan (1984), and *Saishin Ganryo Oyo Gijutsu* (*Latest Pigment Application Technology*), CMC Shuppan (1986).

The particle diameter of the pigment is preferably from 0.01 to 10 μm, more preferably from 0.05 to 1 μm, still more preferably from 0.1 to 1 μm. Within this range, good stability of the pigment dispersion in the coating solution for the image recording layer and good uniformity of the image recording layer can be obtained.

As for the method of dispersing the pigment, a known dispersion technique employed in the production of ink or toner may be used. Examples of the dispersing machine include an ultrasonic disperser, a sand mill, an attritor, a pearl mill, a super-mill, a ball mill, an impeller, a disperser, a KD mill, a colloid mill, a dynatron, a three-roll mill and a pressure kneader. These are described in detail in *Saishin Ganryo Oyo Gijutsu* (*Latest Pigment Application Technology*), CMC Shuppan (1986).

The infrared absorbent may be added together with other components in the same layer or may be added to a layer provided separately, but the infrared absorbent is preferably added such that when a negative lithographic printing plate precursor is produced, the absorbancy of the image recording layer at a maximum absorption wavelength in the wavelength range of 760 to 1,200 nm becomes from 0.3 to 1.2, more preferably from 0.4 to 1.1, as measured by a reflection measuring method. Within this range, a uniform polymerization reaction proceeds in the depth direction of the image recording layer, and the image part can have good film strength and good adhesion to the support.

The absorbancy of the image recording layer can be adjusted by the amount of the infrared absorbent added to the image recording layer and the thickness of the image recording layer. The absorbancy can be measured by an ordinary method. Examples of the measuring method include a method where an image recording layer having a thickness appropriately decided within the range of the dry coated amount necessary as a lithographic printing plate is formed on a reflective support such as aluminum and the reflection density is measured by an optical densitometer, and a method of measuring the absorbancy by a spectrophotometer according to a reflection method using an integrating sphere.

<(B) Polymerization Initiator>

The polymerization initiator for use in the present invention is a compound of generating a radical by the effect of light or heat energy and thereby initiating or accelerating the polymerization of a compound having a polymerizable unsaturated group. Such a radical generator may be appropriately selected and used from known polymerization initiators, compounds having a bond with a small bond-dissociation energy, and the like.

Examples of the compound of generating a radical include organohalogen compounds, carbonyl compounds, organic peroxides, azo-based polymerization initiators, azide compounds, metallocene compounds, hexaarylbiimidazole compounds, organoboron compounds, disulfone compounds, oxime ester compounds and onium salt compounds.

Specific examples of the organohalogen compound include the compounds described in Wakabayashi et al., *Bull. Chem. Soc. Japan,* 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, M. P. Hutt, *Journal of Heterocylic Chemistry,* 1, No. 3 (1970). In particular, oxazole compounds substituted with a trihalomethyl group and S-triazine compounds are preferred.

Furthermore, s-triazine derivatives where at least one mono-, di- or tri-halogenated methyl group is bonded to the s-triazine ring, and oxadiazole derivatives where the methyl group is bonded to the oxadiazole ring, are more preferred. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6 bis (trichloromethyl)-s-triazine, 2-styryl-4,6-bis (trichloromethyl)-s-triazine, 2-(p-methoxy-styryl)-4,6-bis (trichloromethyl)-s-triazine, 2-(p-i-propyloxystyryl)-4,6-bis (trichloromethyl)-s-triazine, 2-(p-tolyl)-4,6-bis (trichloromethyl)-s-triazine, 2-(4-methoxynaphthyl)-4,6-bis (trichloromethyl)-s-triazine, 2-phenylthio-4,6-bis (trichloromethyl)-s-triazine, 2-benzylthio-4,6-bis (trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis (tribromomethyl)-s-triazine and compounds shown below.

(I)-1
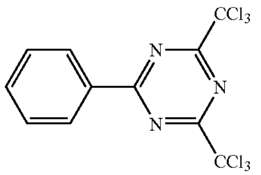
(I)-2
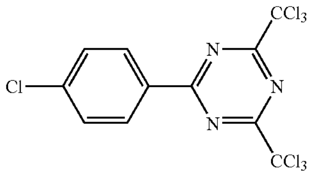
(I)-3
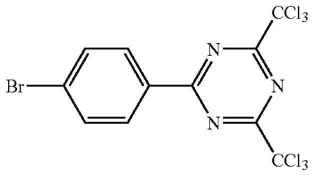
(I)-4
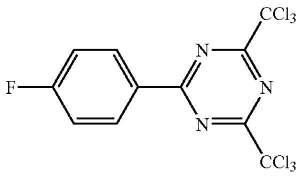
(I)-5
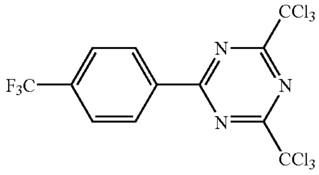
(I)-6
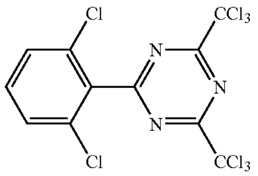
(I)-7
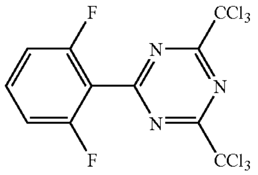
(I)-8
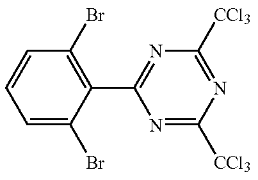
-continued
(I)-9
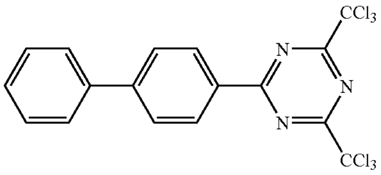
(I)-10
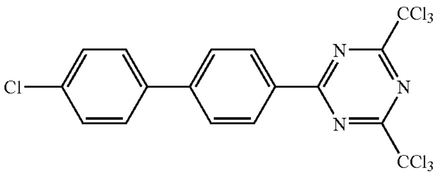
(I)-11
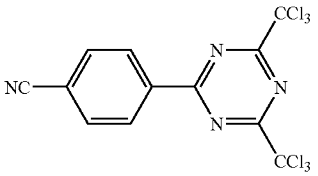
(I)-12
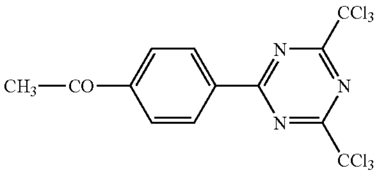
(I)-13
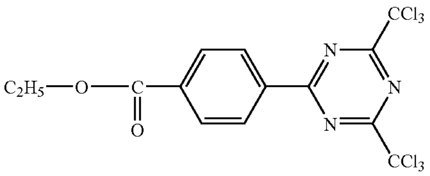
(I)-14
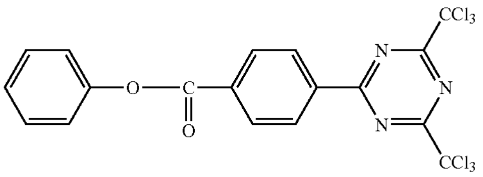
(I)-15
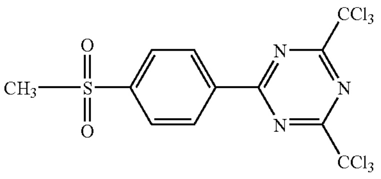
(I)-16
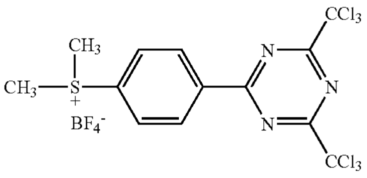

-continued (I)-17

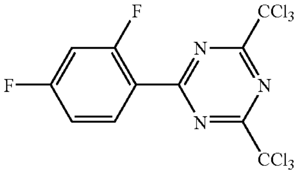

(I)-18

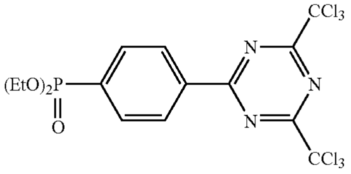

(I)-19

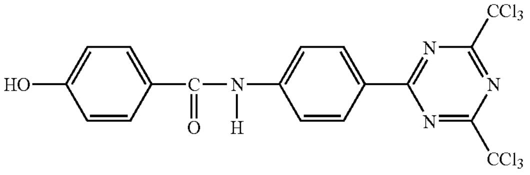

(I)-20

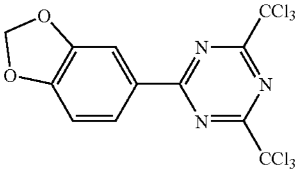

(I)-21

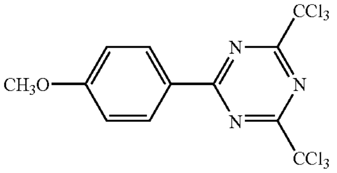

(I)-22

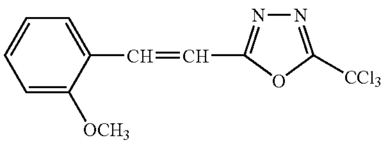

(I)-23

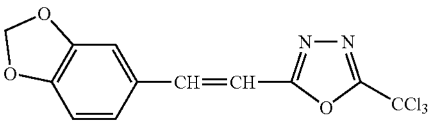

(I)-24

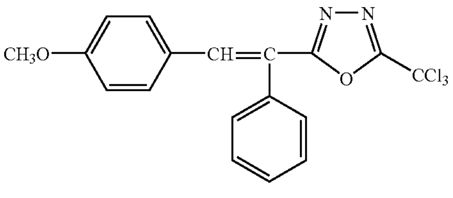

(I)-25

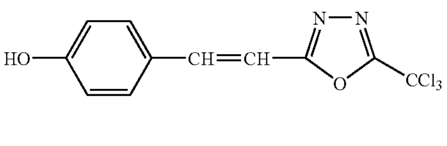

-continued (I)-26

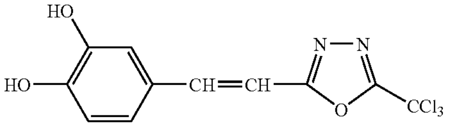

(I)-27

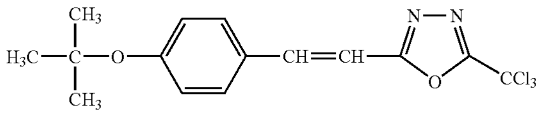

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexyl phenyl ketone, α-hydroxy-2-methylphenylpropanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone and 1,1,1-trichloromethyl-(p-butylphenyl) ketone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; and benzoic acid ester derivatives such as ethyl p-dimethylaminobenzoate and ethyl p-diethylaminobenzoate.

Examples of the azo-based compound which can be used include azo compounds described in JP-A-8-108621.

Examples of the organic peroxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tenbutyl peroxypivalate, tert-butyl peroxyneodecanoate, tert-butyl peroxyoctanoate, tert-butyl peroxylaurate, tert-carbonate, 3,3',4,4'-tetra(tert-butylperoxycarbonyl)benzophenone, 3,3',4,4'-tetra(tert-hexyl-peroxycarbonyl)benzophenone, 3,3',4,4'-tetra(p-isopropyl-cumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, and iron-arene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4,5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the organoboron compound include organoborates described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, *Rad Tech '98. Proceeding Apr.* 19-22, 1998 *Chicago*; organoboron sulfonium complexes and organoboron oxosulfonium complexes described in JP-A-6-157623, JP-A-6-175564 and JP-A-6-175561; organoboron iodonium complexes described in JP-A-6-175554 and JP-A-6-175553; organoboron phosphonium complexes described in JP-A-9-188710; and organoboron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2003-328465.

Examples of the oxime ester compound include compounds described in *J.C.S. Perkin II,* 1653-1660 (1979), *J.C.S. Perkin II,* 156-162 (1979), *Journal of Photopolymer Science and Technology,* 202-232 (1995), JP-A-2000-66385 and JP-A-2000-80068. Specific examples thereof include the compounds shown by the following structural formulae.

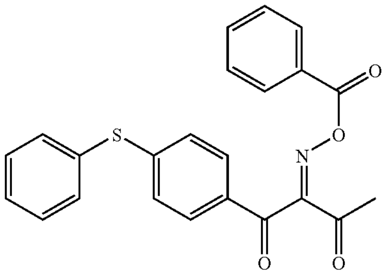

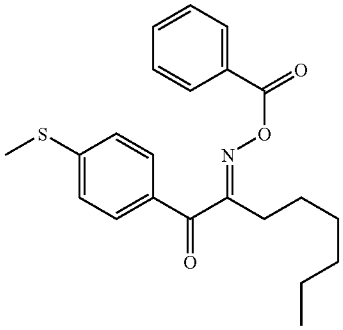

-continued

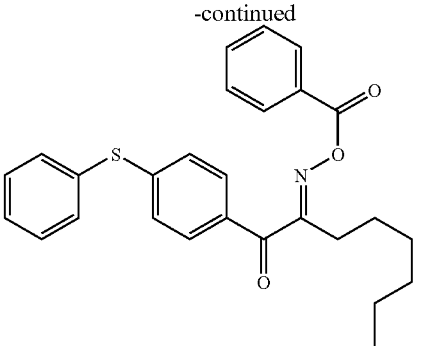

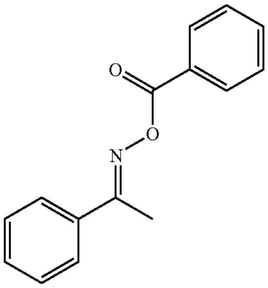

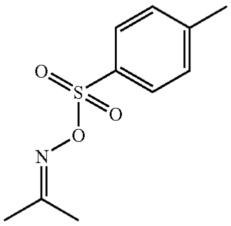

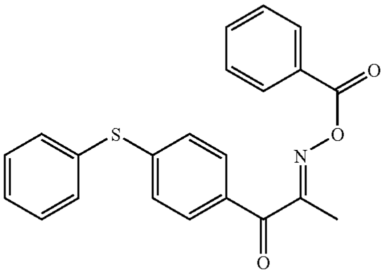

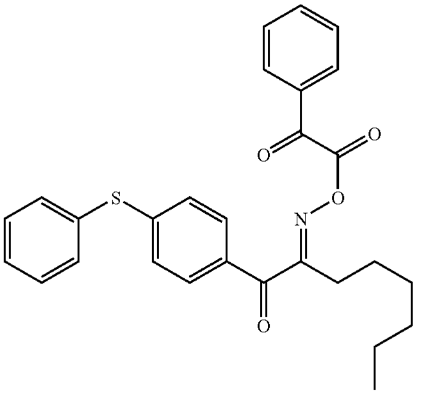

-continued
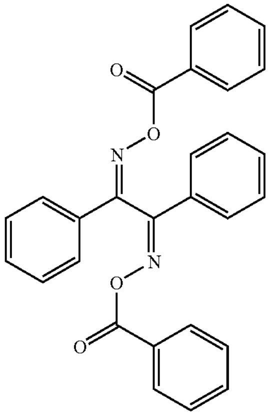
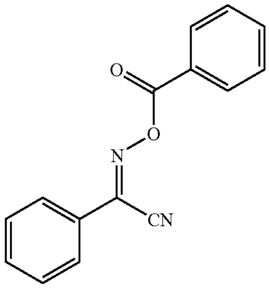
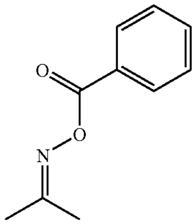
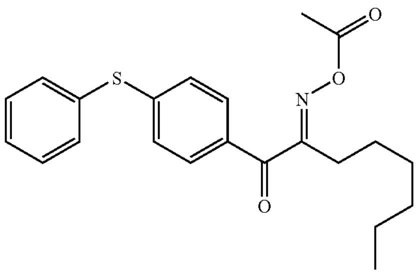
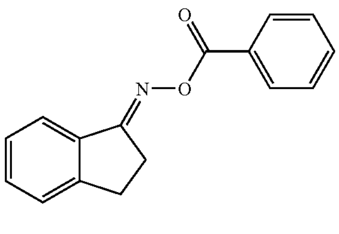
-continued
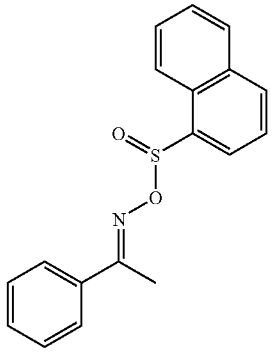
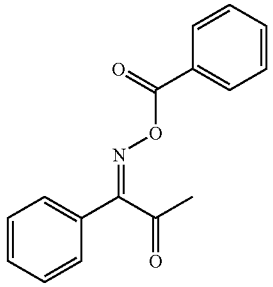
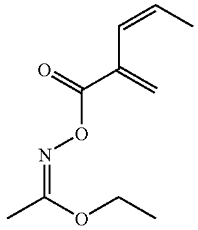
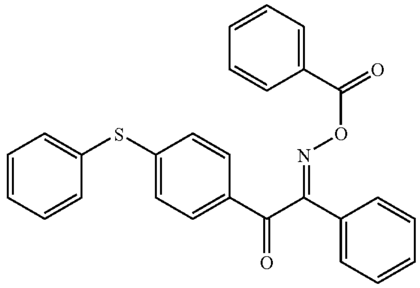
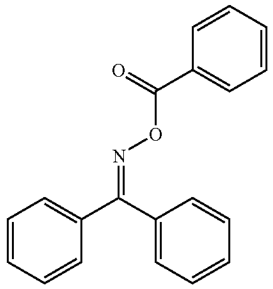

-continued

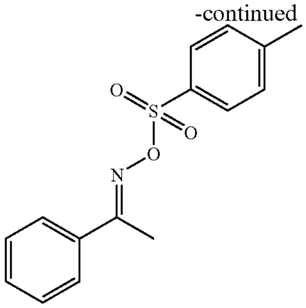

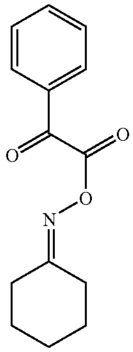

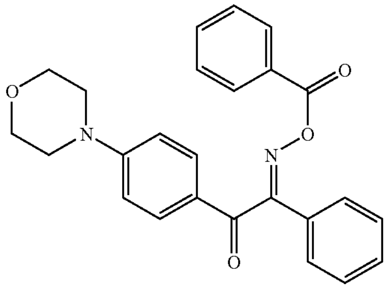

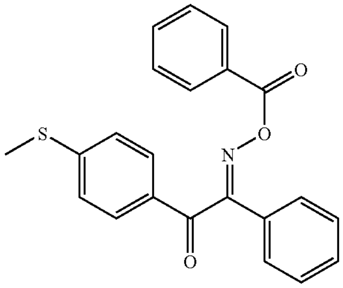

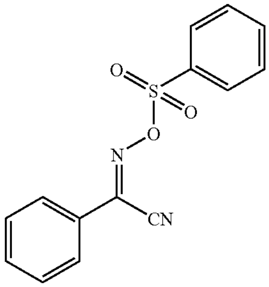

Examples of the onium salt compound include onium salts such as diazonium salts described in S. I. Schlesinger, *Photogr. Sci. Eng.* 18, 387 (1974) and T. S. Bal et al., *Polymer,* 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in European Patent 104,143, U.S. Pat. Nos. 339,049 and 410,201, JP-A-2-150848 and JP-A-2-296514; sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581; selenonium salts described in J. V. Crivello et al., *Macromolecules* 10 (6), 1307 (1977) and J. V. Crivello et al., *J. Polymer Sci.*, Polymer Chem. Ed., 17, 1047 (1979); and arsonium salts described in C. S. Wen et al., *Teh. Proc. Conf. Rad. Curing ASIA*, p. 478, Tokyo, October (1988).

In the present invention, these onium salts act as an ionic radical polymerization initiator but not as an acid generator.

The onium salt suitably used in the present invention is an onium salt represented by any one of the following formulae (RI-I) to (RI-III):

$$Ar_{11}—N^{+}\equiv N \quad Z_{11}^{-} \qquad \text{(RI-I)}$$

$$Ar_{21}—I^{+}—Ar_{22} \quad Z_{21}^{-} \qquad \text{(RI-II)}$$

(RI-III)

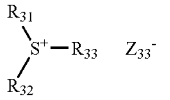

In formula (RI-I), $Ar_{11}$ represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^{-}$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability are perchlorate ion, hexafluorophosphate ion, tetrafluoroborate ion, sulfonate ion and sulfinate ion.

In formula (RI-II), $Ar_{21}$ and $Ar_{22}$ each independently represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^{-}$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion.

In formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion. The carboxylate ion described in JP-A-2001-343742 is more preferred, and the carboxylate ion described in JP-A-2002-148790 is still more preferred.

(N-1)

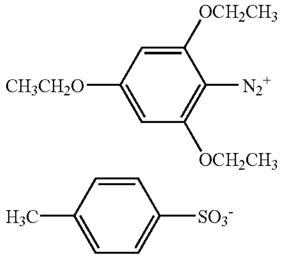

(N-2)

$PF_6^-$ (N-3)

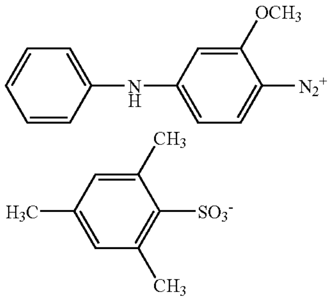

(N-4)

$ClO_4^-$ (N-5)

$PF_6^-$ (N-6)

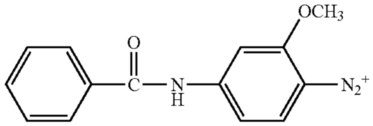

$CF_3SO_3^-$ (N-7)

$BF_4^-$

-continued (N-8)

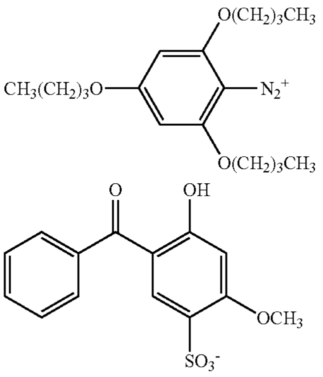

(N-9)

$ClO_4^-$ (N-10)

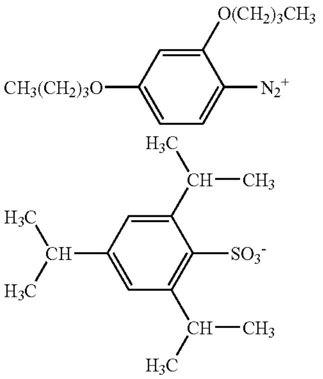

(N-11)

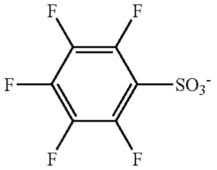

(N-12)

$PF_6^-$ (N-13)

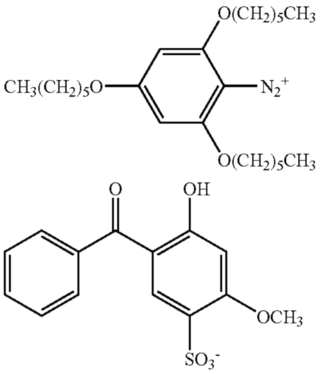

(N-14)

$ClO_4^-$ (N-15)

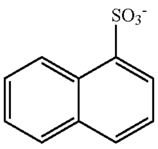

-continued
(N-16)
$PF_6^-$
(N-17)
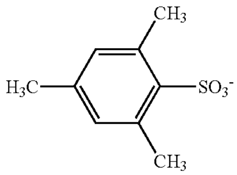
(I)-1
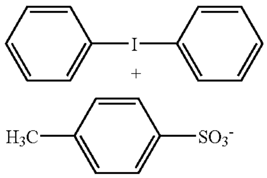
(I-2)
$PF_6^-$
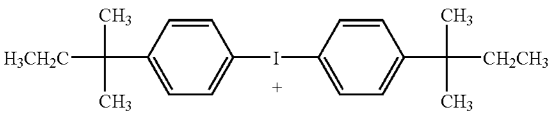
(I-3)
$PF_6^-$
(I-4)
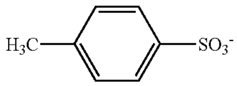
(I-5)
$ClO_4^-$
(I-6)
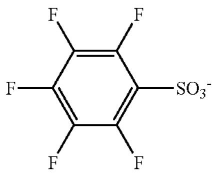
(I-7)
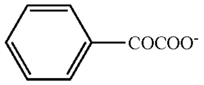
(I-8)
$CF_3SO_3^-$
(I-9)
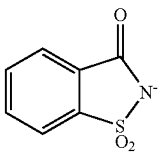
(I-10)
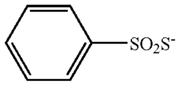
(I-11)
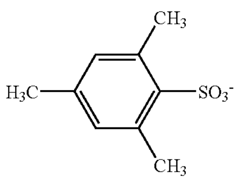
-continued
(I-12)
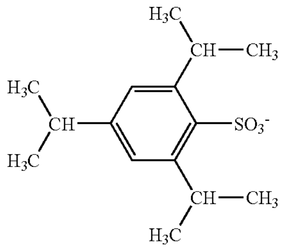
(I-13)
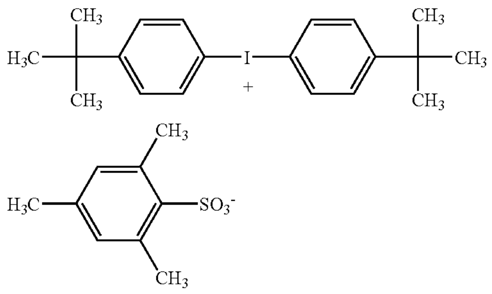
(I-14)
$ClO_4^-$
(I-15)
$PF_6^-$
(I-16)
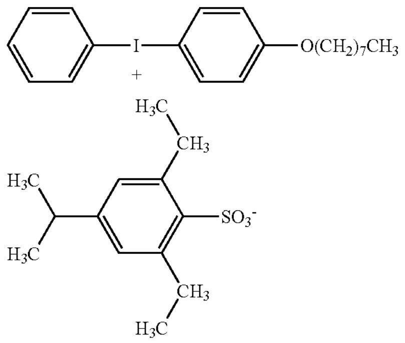
(I-17)
$CF_3COO^-$
(I-18)
$CF_3SO_3^-$
(I-19)
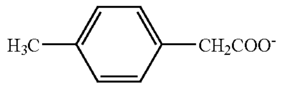
(I-20)
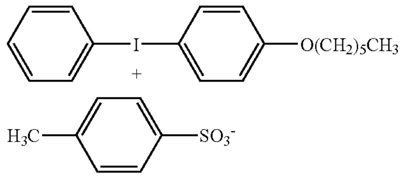
(I-21)
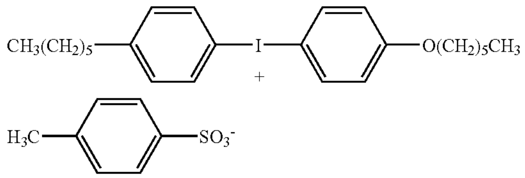

-continued
(I-22)
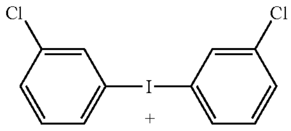
$BF_4$-
(I-23)
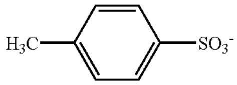
(I-18)
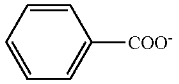
(S-1)
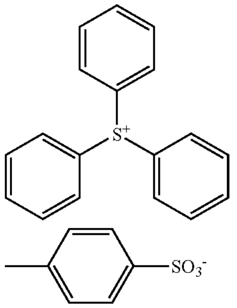
(S-2)
$PF_6^-$
(S-3)
$ClO_4$
(S-4)
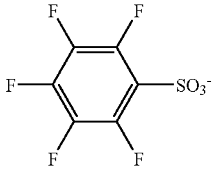
(S-5)
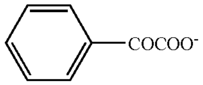
(S-6)
$CF_3SO_3^-$
(S-7)
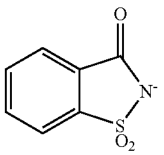
(S-8)
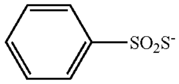
(S-9)
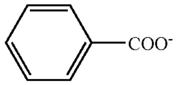
-continued
(S-10)
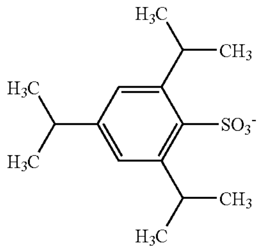
(S-11)
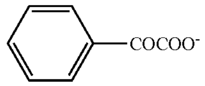
(S-12)
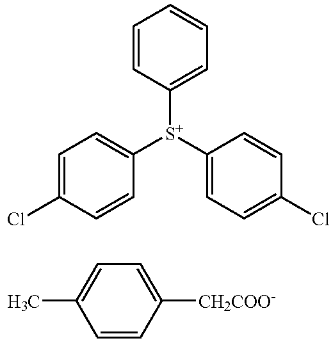
(S-13)
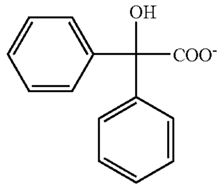
(S-14)
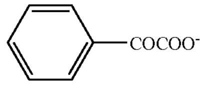
(S-15)
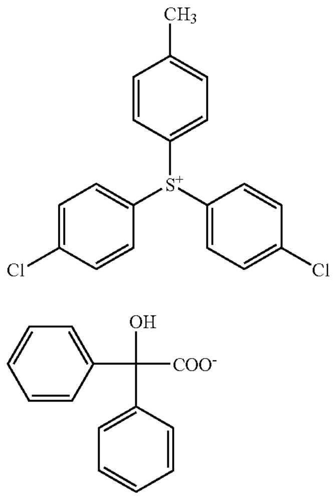

-continued (S-16)

$BF_4^-$ (S-17)

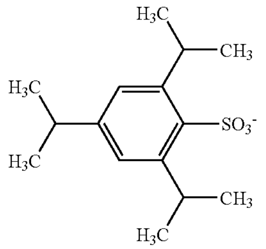

(S-18)

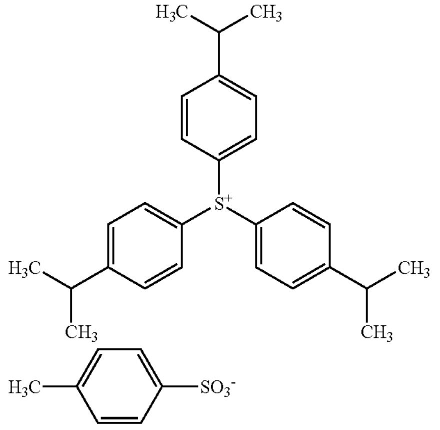

The polymerization initiator is not limited to those described above but particularly in view of reactivity and stability, a triazine-based initiator, an organohalogen compound, an oxime ester compound, a diazonium salt, an iodonium salt and a sulfonium salt are more preferred.

When a sensitizer is used in combination with the polymerization initiator selected from above in the image recording layer of a lithographic printing plate precursor of performing imagewise exposure by using a light source of emitting light at 250 to 420 nm, the radical generation efficiency can also be elevated.

Specific examples of the sensitizer include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone.

Furthermore, preferred examples of the sensitizer for use in the present invention include a compound represented by formula (III) described in JP-B-51-48516:

(II)

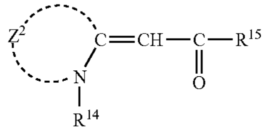

In formula (III), $R^{14}$ represents an alkyl group (e.g., methyl, ethyl, propyl) or a substituted alkyl group (e.g., 2-hydroxyethyl, 2-methoxyethyl, carboxymethyl, 2-carboxyethyl), and $R^{15}$ represents an alkyl group (e.g., methyl, ethyl) or an aryl group (e.g., phenyl, p-hydroxyphenyl), naphthyl, thienyl).

$Z^2$ represents a nonmetallic atom group necessary for forming a nitrogen-containing heterocyclic nucleus usually used in cyanine dyes, and examples of the nonmetallic atom group include benzothiazoles (e.g., benzothiazole, 5-chlorobenzothiazole, 6-chlorothiazole), naphthothiazoles (e.g., α-naphthothiazole, β-naphthothiazole), benzoselenazoles (e.g., benzoselenazole, 5-chlorobenzoselenazole, 6-methoxybenzoselenazole), naphthoselenazoles (e.g., α-naphthoselenazole, β-naphthoselenazole), benzoxazoles (e.g., benzoxazole, 5-methylbenzoxazole, 5-phenylbenzoxazole) and naphthoxazoles (e.g., α-naphthoxazole, β-naphthoxazole).

Specific examples of the compound represented by formula (III) include those having a chemical structure constituted by combining these $Z^2$, $R^{14}$ and $R^{15}$. Many of such compounds are present as a known substance and therefore, the compound may be appropriately selected and used from those known substances. Other preferred examples of the sensitizer for use in the present invention include merocyanine dyes described in JP-B-5-47095 and ketocoumarin-based compounds represented by the following formula (IV):

(IV)

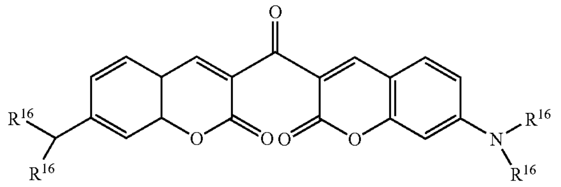

wherein $R^{16}$ represents an alkyl group such as methyl group and ethyl group.

As for the sensitizer used in the present invention, the compounds described as a sensitizing dye in JP-A-2001-100421 and JP-A-2003-221517 may also be suitably used.

The sensitizer can be added at a ratio of preferably from 0.1 to 50 weight %, more preferably from 0.5 to 30 weight %, still more preferably from 0.8 to 20 weight %, based on all solid contents constituting the image recording layer.

These polymerization initiator and sensitizer each can be added at a ratio of preferably 0.1 to 50 weight %, more preferably from 05 to 30 weight %, still more preferably from 0.8 to 20 weight %, based on all solid contents constituting the image recording layer. Within this range, good sensitivity and good antiscumming property of the non-image part at the printing can be obtained. One of these polymerization initiators may be used alone, or two or more thereof may be used in combination. Also, the polymerization initiator may be added together with other components in the same layer or may be added to a layer separately provided.

<(C) Polymerizable Compound>

The polymerizable compound which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation.

These compounds have a chemical mode such as monomer, prepolymer (that is, dimer, trimer or oligomer) or a mixture or copolymer thereof. Examples of the monomer and its copolymer include an unsaturated carboxylic acid (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydrating condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and displacement reaction products of an unsaturated carboxylic acid ester or amide having a disorptive substituent such as halogen group or tosyloxy group with a monofunctional or polyfunctional alcohol, amine or thiol may also be suitably used. In addition, compounds where the unsaturated carboxylic acid of the above-described compounds is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane and bis[p-(methacryloxyethoxy) phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Other examples of the ester include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of an isocyanate and a hydroxyl group is also preferred and specific examples thereof include vinyl urethane compounds having two or more polymerizable vinyl groups within one molecule described in JP-B-48-41708, which are obtained by adding a vinyl monomer having a hydroxyl group represented by the following formula (V) to a polyisocyanate compound having two or more isocyanate groups within one molecule:

$$CH_2{=}C(R_4)COOCH_2CH(R_5)OH \quad (V)$$

(wherein $R_4$ and $R_5$ each represents H or $CH_3$).

In addition, urethane acrylates described in JP-A-51-37193, JP-B-2-32293 and JP-B-2-16765, and urethane compounds having an ethylene oxide-type skeleton described in JP-B-5849860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, a photopolymerizable composition having very excellent photosensitization speed can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. Also, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Adhesion, Vol.* 20, No. 7, pp. 300-308 (1984) may also be used.

Details of the use method of these addition-polymerizable compounds, such as structure, sole or combination use and amount added, can be freely selected in accordance with the designed performance of the final lithographic printing plate precursor and, for example, may be selected from the following standpoints.

In view of sensitivity, a structure having a large unsaturated group content per molecule is preferred and in most cases, a bifunctional or greater functional compound is preferred. For increasing the strength of the image part, namely, the cured layer, a trifunctional or greater functional compound is preferred. Also, a method of controlling both sensitivity and strength by using a combination of compounds differing in the functional number and in the polymerizable group (for example, an acrylic acid ester, a methacrylic acid ester, a styrene-based compound or a vinyl ether-based compound) is effective.

The selection and use method of the addition-polymerizable compound are important factors also in the light of compatibility and dispersibility with other components (e.g., binder polymer, initiator, coloring agent) in the image recording layer. For example, the compatibility may be enhanced in some cases by using a low purity compound or using two or more compounds in combination. Also, a specific structure may be selected for the purpose of enhancing the adhesion to the substrate, protective layer which is described later, or the like.

The polymerizable compound is preferably used in an amount of 5 to 80 weight %, more preferably from 25 to 75 weight %, based on all solid contents constituting the image recording layer. Also, these polymerizable compounds may be used individually or in combination of two or more thereof.

Other than these, as for the use method of the polymerizable compound, appropriate structure, formulation and amount added can be freely selected by taking account of the degree of polymerization inhibition due to oxygen, resolution, fogging, change in refractive index, surface tackiness and the like. Depending on the case, a layer structure or coating method such as undercoat and overcoat can also be employed.

<Microcapsule-Microgel>

In the present invention, as for the method of incorporating the image recording layer-constituting components into the image recording layer, several embodiments may be employed. One embodiment is a molecule dispersion-type image recording layer described, for example, in JP-A-2002-287334, where the constituent components are dissolved in an appropriate solvent and the resulting solution is coated. Another embodiment is a microcapsule-type image recording layer described, for example, JP-A-2001-277740 and JP-A-2001-277742, where the constituent components are entirely or partially enclosed in a microcapsule and the microcapsule is contained in the image recording layer. In the microcapsule-type image recording layer, the constituent components may also be incorporated outside the microcapsule. In the case of the microcapsule-type image recording layer, it is preferred that hydrophobic constituent components are enclosed in a microcapsule and hydrophilic constituent components are incorporated outside the microcapsule. Still another embodiment is an image recording layer containing a crosslinked resin particle, that is, a microgel. The microgel may contain a part of the constituent components in the inside and/or on the surface thereof. In particular, a reactive microgel having on the surface thereof a polymerizable compound is preferred in view of sensitivity at the image formation and press life.

In order to obtain more excellent on-press developability, the image recording layer is preferably a microcapsule-type or microgel-type image recording layer.

For forming a microcapsule or a microgel containing the constituent components of the image recording layer, conventionally known methods can be used.

Examples of the production method of a microcapsule include, but are not limited to, a method utilizing coacervation described in U.S. Pat. Nos. 2,800,457 and 2,800,458, a method utilizing interfacial polymerization described in U.S. Pat. No. 3,287,154, JP-B-38-19574 and JP-B-42-446, a method utilizing polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall-forming material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method utilizing monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has a three-dimensionally crosslinked structure and has a property of swelling with a solvent. From this standpoint, the wall material of microcapsule is preferably polyurea, polyurethane, polyester, polycarbonate, polyamide or a mixture thereof, more preferably polyurea or polyurethane. Also, a compound having a crosslinkable functional group such as ethylenically unsaturated bond, which can be introduced into the binder polymer, may be introduced into the microcapsule wall.

As for the method of preparing a microgel, granulation by interfacial polymerization described in JP-B-38-19574 and JP-B-42-446, and granulation by nonaqueous dispersion polymerization described in JP-A-5-61214 can be used, but the present invention is not limited to these methods.

In the method utilizing interfacial polymerization, the above-described known production method of a microcapsule can be applied.

The microgel for use in the present invention is preferably granulated by interfacial polymerization and has a three-dimensionally crosslinked structure. From these standpoints, the material used therefor is preferably polyurea, polyurethane, polyester, polycarbonate, polyamide or a mixture thereof, more preferably polyurea and polyurethane.

The average particle diameter of the microcapsule or microgel is preferably from 0.01 to 3.0 μm, more preferably from 0.05 to 2.0 μm, still more preferably from 0.10 to 1.0 μm. Within this range, good resolution and good aging stability can be obtained.

<Other Components of Image Recording Layer>

The image recording layer of the present invention may further contain various additives, if desired. These are described below.

<Binder Polymer>

The image recording layer of the present invention may contain a binder polymer for enhancing the film strength of the image recording layer. As for the binder polymer, conventionally known binder polymers can be used without limitation, and a polymer having a film property is preferred. Examples of such a binder polymer include acrylic resin, polyvinyl acetal resin, polyurethane resin, polyurea resin, polyimide resin, polyamide resin, epoxy resin, methacrylic resin, polystyrene-based resin, novolak-type phenol-based resin, polyester resin, synthetic rubber and natural rubber.

The binder polymer may have a crosslinking property so as to enhance the film strength in the image part. The crosslinking property may be imparted to the binder polymer by introducing a crosslinkable functional group such as ethylenically unsaturated bond into the main or side chain of the polymer. The crosslinkable functional group may also be introduced by copolymerization.

Examples of the polymer having an ethylenically unsaturated bond in the main chain of the molecule include poly-1,4-butadiene and poly-1,4-isoprene.

Examples of the polymer having an ethylenically unsaturated bond in the side chain of the molecule include polymers which are a polymer of acrylic or methacrylic acid ester or amide and in which the ester or amide residue (R in —COOR or —CONHR) has an ethylenically unsaturated bond.

Examples of the residue (R above) having an ethylenically unsaturated bond include $-(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH^2)_nNH-CO-O-CH_2CR^1{=}CR^2R^3$ and $-(CH_2)_n-O-CO-CR^1{=}CR^2R^3(CH_2CH_2O)_2-X$ (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^3$ may combine with each other to form a ring, n represents an integer of 1 to 10, and X represents a dicyclopentadienyl residue).

Specific examples of the ester residue include $-CH_2CH{=}CH_2$ (described in JP-B-7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$ and $-CH_2CH_2-NHCOO-CH_2CH{=}CH_2CH_2CH_2O-X$ (wherein X represents a dicyclopentadienyl residue).

Specific examples of the amide residue include $-CH_2CH{=}CH_2$, $-CH_2CH_2-Y$ (wherein Y represents a cyclohexene residue) and $-CH_2CH_2-OCO-CH{=}CH_2$.

In the binder polymer having a crosslinking property, for example, a free radical (a polymerization initiating radical or a radical grown in the process of polymerization of a polymerizable compound) is added to the crosslinkable functional group to cause addition-polymerization between polymers directly or through a polymerization chain of the polymerizable compound, as a result, crosslinking is formed between polymer molecules and thereby curing is effected. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between polymer molecules, thereby effecting curing.

The content of the crosslinkable group (content of radical-polymerizable unsaturated double bond determined by iodine titration) in the binder polymer is preferably from 0.1 to 10.0 mmol, more preferably from 1.0 to 7.0 mmol, and most preferably from 2.0 to 5.5 mmol, per g of the binder polymer. Within this range, good sensitivity and good storage stability can be obtained.

In the present invention, a hydrophilic binder polymer described below may also be used in addition to the above-described binder polymer. The hydrophilic binder polymer not only elevates the permeability of the fountain solution into the image recording layer to enhance the on-press developability but also is effective, for example, in stabilizing the dispersion of the microcapsule.

Examples of the hydrophilic binder polymer which can be suitably used include those having a hydrophilic group such as hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a hydrolysis degree of 60 mol % or more, preferably 80 mol % or more, polyvinyl formal, polyvinyl butyral, polyvinylpyrrolidone, homopolymers and polymers of acrylamide, homopolymers and copolymers of methacrylamide, homopolymers and copolymers of N-methylolacrylamide, polyvinylpyrrolidone, alcohol-soluble nylons, and polyethers of 2,2-bis-(4-hydroxyphenyl)-propane with epichlorohydrin.

The binder polymer preferably has a weight average molecular weight of 5,000 or more, more preferably from 10,000 to 300,000. The number average molecular weight thereof is preferably 1,000 or more, more preferably from 2,000 to 250,000. The polydispersity (weight average molecular weight/number average molecular weight) is preferably from 1.1 to 10.

The binder polymer can be synthesized by a conventionally know method. Examples of the solvent used for the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide and water. These solvents are used individually or as a mixture of two or more thereof.

As for the radical polymerization initiator used in the synthesis of the binder polymer, known compounds such as azo-type initiator and peroxide initiator can be used.

The binder polymer content is preferably from 5 to 90 weight %, more preferably from 5 to 80 weight %, still more preferably from 10 to 70 weight %, based on the entire solid content of the image recording layer. Within this range, good strength of image part and good image-forming property can be obtained.

The polymerizable compound and the binder polymer are preferably used in amounts of giving a weight ratio of 0.5/1 to 4/1.

<Surfactant>

In the present invention, a surfactant is preferably used in the image recording layer so as to accelerate the on-press development at the initiation of printing and enhance the coated surface state. The surfactant includes a nonionic surfactant, an anionic surfactant, a cationic surfactant, an amphoteric surfactant, a fluorine-containing surfactant and the like. The surfactants may be used individually or in combination of two or more thereof.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamines, triethanolamine fatty acid esters, trialkylamine oxides, polyethylene glycol, and copolymers of polyethylene glycol and polypropylene glycol.

The anionic surfactant for use in the present invention is not particularly limited and a conventionally known anionic surfactant can be used. Examples thereof include fatty acid salts, abietates, hydroxyalkanesulfonates, alkanesulfonates, dialklsulfosuccinic ester salts, linear alkylbenzenesulfonates, branched alkylbenzenesulfonates, alkylnaphthalenesulfonates, alkylphenoxypolyoxyethylenepropylsulfonates, polyoxyethylenealkylsulfophenyl ether salts, N-methyl-N-oleyltaurine sodium salts, monoamide disodium N-alkylsulfosuccinates, petroleum sulfonates, sulfated beef tallow oils, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene/maleic anhydride copolymerization products, partially saponified olefin/maleic anhydride copolymerization products and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylenealkylamine salts and polyethylene polyamine derivatives.

The amphoteric surfactant for use in the present invention is not particularly limited and a conventionally known amphoteric surfactant can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, fluorine-containing surfactants described in JP-A-62-170950, JP-A-62-226143 and JP-A-60-168144 may also be suitably used.

The surfactants can be used individually or in combination of two or more thereof.

The surfactant content is preferably from 0.001 to 10 weight %, more preferably from 0.01 to 7 weight %, based on the entire solid content of the image recording layer.

<Coloring Agent>

In the present invention, various compounds may be further added, if desired, in addition to the above-described additives. For example, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), VictodaPure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-based pigment, azo-based pigment, carbon black and titanium oxide may be suitably used.

The coloring agent is preferably added, because the image part and the non-image part after image formation can be clearly distinguished. The amount of the coloring agent added is preferably from 0.01 to 10 weight % based on the entire solid content of the image recording material.

<Printing-Out Agent>

In the image recording layer of the present invention, a compound of undergoing change in the color by the effect of an acid or a radical can be added so as to produce a print-out image. As such a compound, various dyes, for example, a diphenylmethane-based dye, a triphenylmethane-based dye, a thiazine-based dye, an oxazine-based dye, a xanthene-based dye, an anthraquinone-based dye, an iminoquinone-based dye, an azo-based dye and an azomethine-based dye, may be effectively used.

Specific examples thereof include dyes such as Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red 5B [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carbostearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenyl methane (Leuco Crystal Violet) and Pergascript Blue SRB (produced by Ciba Geigy).

Other suitable examples include leuco dyes known as a material for thermosensitive or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl) aminofluorane, 2-anilino-3-methyl-6-(N-ethyl-p toluidino) fluorane, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye of undergoing change in the color by the effect of an acid or a radical is preferably added in an amount of 0.01 to 15 weight % based on the entire solid content of the image recording layer.

<Polymerization Inhibitor>

In the image recording layer of the present invention, a small amount of a thermopolymerization inhibitor is preferably added so as to prevent unnecessary thermo-polymerization of the polymerizable compound during the preparation or storage of the image recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermopolymerization inhibitor added is preferably from about 0.01 to about 5 weight % based on the entire solid content of the image recording layer.

<Higher Fatty Acid Derivative, etc.>

In the image recording layer of the present invention, a higher fatty acid derivative such as behenic acid or behenic acid amide may be added to localize on the surface of the image recording layer during drying after coating so as to prevent polymerization inhibition by oxygen. The amount of the higher fatty acid derivative added is preferably from about 0.1 to about 10 weight % based on the entire solid content of the image recording layer.

Plasticizer>

The image recording layer of the present invention may contain a plasticizer for enhancing the on-press developability.

Suitable examples of the plasticizer include phthalic acid esters such as dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate.

The plasticizer content is preferably about 30 weight % or less based on the entire solid content of the image recording layer.

<Inorganic Fine Particle>

The image recording layer of the present invention may contain an inorganic fine particle so as to elevate cured film strength in the image part and enhance the on-press developability of the non-image part.

Suitable examples of the inorganic fine particle include silica, alumina, magnesium oxide, titanium oxide, magnesium carbonate, calcium alginate and a mixture thereof. Even if such an inorganic fine particle has no light-to-heat converting property, this can be used, for example, for strengthening the film or roughening the surface to enhance the interfacial adhesion.

The average particle diameter of the inorganic tine particle is preferably from 5 nm to 10 μm, more preferably from 0.5 to 3 μm. Within this range, the inorganic particles are stably dispersed in the image recording layer so that the image recording layer can maintain sufficiently high film strength and the non-image part formed can have excellent hydrophilicity of causing less staining at printing.

Such an inorganic fine particle is easily available on the market as a colloidal silica dispersion or the like.

The inorganic fine particle content is preferably 20 weight % or less, more preferably 10 weight % or less, based on the entire solid content of the image recording layer.

<Low-Molecular Hydrophilic Compound>

The image recording layer of the present invention may contain a hydrophilic low-molecular compound so as to enhance the on-press developability. Examples of the hydrophilic low-molecular compound include, as the water-soluble organic compound, glycols and ether or ester derivatives thereof, such as ethylene glycol, diethylene glycol, triethylene glycol, propylene glycol, dipropylene glycol and tripropylene glycol, polyhydroxys such as glycerin and pentaerythritol, organic amines and salts thereof, such as triethanolamine, diethanolamine and monoethanolamine, organic sulfonic acids and salts thereof, such as toluenesulfonic acid and benzenesulfonic acid, organic phosphonic acids and salts thereof, such as phenylphosphonic acid, and organic carboxylic acids and salts thereof, such as tartaric acid, oxalic acid, citric acid, malic acid, lactic acid, gluconic acid and amino acids.

<Formation of Image Recording Layer>

The image recording layer of the present invention is formed by dispersing or dissolving the above-described necessary components in a solvent to prepare a coating solution and coating the obtained coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water. These solvents are used individually or in combination. The concentration of the solid contents in the coating solution is preferably from 1 to 50 weight %.

The image recording layer of the present invention may also be formed by dispersing or dissolving the same or different components described above in the same or different solvents to prepare a plurality of coating solutions and repeating the coating and drying multiple times.

The coated amount (solid content) of the image recording layer obtained on the support after coating and drying varies depending on the use but in general, the coated amount is preferably from 0.3 to 3.0 $g/m^2$. Within this range, good sensitivity and good film properties of the image recording layer can be obtained.

For the coating, various methods may be used and examples thereof include bar coater coating, rotary coating, spray coating, curtain coating, dip coating, air knife coating, blade coating and roll coating.

(Support)

The support for use in the lithographic printing plate precursor of the present invention is not particularly limited and may be sufficient if it is a dimensionally stable plate-like material. Examples thereof include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with the above-described metal. Among these supports, polyester film and aluminum plate are preferred, and aluminum plate is more preferred because this is dimensionally stable and relatively inexpensive.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 weight % or less. In the present invention, a pure aluminum plate is preferred, but completely pure aluminum is difficult to produce in view of refining technique and therefore, an aluminum plate containing trace heteroelements may be used. The aluminum plate is not particularly limited in its composition, and those formed of a conventionally known and commonly employed material can be appropriately used.

The thickness of the support is preferably from 0.1 to 0.6 mm, more preferably from 0.15 to 0.4 mm, still more preferably from 0.2 to 0.3 mm.

In advance of using the aluminum plate, the aluminum plate is preferably subjected to a surface treatment such as surface roughening and anodization. This surface treatment facilitates enhancing hydrophilicity and ensuring adhesion between the image recording layer and the support. Before surface-roughening the aluminum plate, a degreasing treatment for removing the rolling oil on the surface is performed, if desired, by using a surfactant, an organic solvent, an alkaline aqueous solution or the like.

The surface-roughening treatment of the aluminum plate surface is performed by various methods and examples thereof include a mechanical surface-roughening treatment, an electrochemical surface-roughening treatment (surface-roughening treatment of electrochemically dissolving the surface) and a chemical surface-roughening treatment (a surface-roughening treatment of chemically and selectively dissolving the surface).

The mechanical surface-roughening treatment may be performed by using a known method such as ball polishing, brush polishing, blast polishing and buff polishing.

The method for the electrochemical surface-roughening treatment includes, for example, a method of passing an alternating or direct current in an electrolytic solution containing an acid such as hydrochloric acid or nitric acid. Also, a method using a mixed acid described in JP-A-54-63902 may be used.

The surface-roughened aluminum plate is, if desired, subjected to an alkali etching treatment using an aqueous solution of potassium hydroxide, sodium hydroxide or the like and after a neutralization treatment, further subjected to an anodization treatment, if desired, so as to enhance the abrasion resistance.

As for the electrolyte for use in the anodization treatment of the aluminum plate, various electrolytes of forming a porous oxide film may be used. In general, sulfuric acid, hydrochloric acid, oxalic acid, chromic acid or a mixed acid thereof is used. The concentration of the electrolyte is determined appropriately in accordance with the type of the electrolyte.

The anodization treatment conditions vary depending on the electrolyte used and therefore, cannot be indiscriminately specified, but in general, the conditions are preferably such that the concentration of electrolyte is from 1 to 80 weight %, the liquid temperature is from 5 to 70° C., the current density is from 5 to 60 A/dm$^2$, the voltage is from 1 to 100 V, and the electrolysis time is from 10 seconds to 5 minutes. The amount of the anodic oxide film formed is preferably from 1.0 to 5.0 g/m$^2$, more preferably from 1.5 to 4.0 g/m$^2$. Within this range, good press life and good scratch resistance in the non-image part of the lithographic printing plate can be obtained.

As for the support used in the invention, the substrate having thereon an anodic oxide film after the above-described surface treatment may be used as-is, but in order to more improve adhesion to the upper layer, hydrophilicity, antiscumming property, heat insulation and the like, treatments described in JP-A-2001-253181 and JP-A-2001-322365, such as treatment for enlarging micropores of the anodic oxide film, pore-sealing treatment of micopores and surface-hydrophilizing treatment of dipping the substrate in an aqueous solution containing a hydrophilic compound, may be appropriately selected and applied. Of course, the enlarging treatment and pore-sealing treatment are not limited to those described in these patent publications and any conventionally known method may be employed.

The pore-sealing treatment may be, other than the pore-sealing treatment with steam, a pore-sealing treatment with fluorozirconic acid alone, a pore-sealing treatment with an aqueous solution containing an inorganic fluorine compound, such as treatment with sodium fluoride, a port-sealing treatment with steam having added thereto lithium chloride, or a pore-sealing treatment with hot water.

Among these, a pore-sealing treatment with an aqueous solution containing an inorganic fluorine compound, a pore-sealing treatment with water vapor, and a pore-sealing treatment with hot water are preferred. These are described below.

<Pore-Sealing Treatment with Aqueous Solution Containing Inorganic Fluorine Compound>

The inorganic fluorine compound used in the pore-sealing treatment with an aqueous solution containing an inorganic fluorine compound is preferably a metal fluoride.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among these, sodium fluorozirconate, sodium fluorotitanate, fluorozirconic acid and fluorotitanic acid are preferred.

The concentration of the inorganic fluorine compound in the aqueous solution is, in view of satisfactory sealing of micropores of the anodic oxide film, preferably 0.01 weight % or more, more preferably 0.05 weight % or more, and in view of antiscumming property, preferably 1 weight % or less, more preferably 0.5 weight % or less.

The aqueous solution containing an inorganic fluorine compound preferably further contains a phosphate compound. When a phosphate compound is contained, the hydrophilicity on the anodic oxide film surface is elevated and in turn, the on-press developability and antiscumming property can be enhanced.

Suitable examples of the phosphate compound include phosphates of an alkali metal, an alkaline earth metal or the like.

Specific examples thereof include zinc phosphate, aluminum phosphate, ammonium phosphate, diammonium hydrogenphosphate, ammonium dihydrogenphosphate, monoammonium phosphate, monopotassium phosphate, monosodium phosphate, potassium dihydrogenphosphate, dipotassium hydrogenphosphate, calcium phosphate, sodium ammonium hydrogenphosphate, magnesium hydrogenphosphate, magnesium phosphate, ferrous phosphate, ferric phosphate, sodium dihydrogenphosphate, sodium phosphate, disodium hydrogenphosphate, lead phosphate, diammonium phosphate, calcium dihydrogenphosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among these, sodium dihydrogenphosphate, disodium hydrogenphosphate, potassium dihydrogenphosphate and dipotassium hydrogenphosphate are preferred.

The combination of the inorganic fluorine compound and the phosphate compound is not particularly limited, but the aqueous solution preferably contains at least sodium fluorozirconate as the inorganic fluorine compound and at least sodium dihydrogenphosphate as the phosphate compound.

The concentration of the phosphate compound in the aqueous solution is, in view of enhancement in the on-press developability and antiscumming property, preferably 0.01 weight % or more, more preferably 0.1 weight % or more, and in view of solubility, preferably 20 weight % or less, more preferably 5 weight % of less.

The ratio of respective compounds in the aqueous solution is not particularly limited, but the weight ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and preferably 100° C. or less, more preferably 80° C. or less.

The pH of the aqueous solution is preferably 1 or more, more preferably 2 or more, and preferably 11 or less, more preferably 5 or less.

The method for the pore-sealing treatment with an aqueous solution containing an inorganic fluorine compound is not particularly limited, but examples thereof include a dipping method and a spray method. One of these methods may be used alone once or multiple times, or two or more thereof may be used in combination.

In particular, a dipping method is preferred. In the case of performing the treatment by using a dipping method, the treating time is preferably 1 second or more, more preferably 3 seconds or more, and preferably 100 seconds or less, more preferably 20 seconds or less.

<Pore-Sealing Treatment with Water Vapor>

Examples of the method for the port-sealing treatment with water vapor include a method of continuously or discontinuously bringing water vapor under applied pressure or normal pressure into contact with the anodic oxide film.

The temperature of the water vapor is preferably 80° C. or more, more preferably 95° C. or more, and preferably 105° C. or less.

The pressure of the water vapor is preferably from (atmospheric pressure −50 mmAq) to (atmospheric pressure +300 mmaq) (from $1.008\times10^5$ to $1.043\times10^5$ Pa).

The time period for which water vapor is contacted is preferably 1 second or more, more preferably 3 seconds or more, and preferably 100 seconds or less, more preferably 20 seconds or less.

<Pore-Sealing Treatment with Hot Water>

Examples of the method for the pore-sealing treatment with hot water include a method of dipping the aluminum plate having formed thereon the anodic oxide film in hot water.

The hot water may contain an inorganic salt (e.g., phosphate) or an organic salt.

The temperature of the hot water is preferably 80° C. or more, more preferably 95° C. or more, and preferably 100° C. or less.

The time period for which the aluminum plate is dipped in hot water is preferably 1 second or more, more preferably 3 seconds or more, and preferably 100 seconds or less, more preferably 20 seconds or less.

As for the hydrophilization treatment, an alkali metal silicate method described in U.S. Pat. Nos. 2,714,066, 3,181,461, 3,280,734 and 3,902,734 is known. In this method, the support is dipped in an aqueous solution of sodium silicate or the like, or electrolyzed. Other examples include a method of treating the support with potassium fluorozirconate described in JP-B-36-22063, and a method of treating the support with polyvinylphosphonic acid described in U.S. Pat. Nos. 3,276,868, 4,153,461 and 4,689,272.

In the case where a support having a surface insufficient in the hydrophilicity, such as polyester film, is used as the support of the present invention, a hydrophilic layer is preferably coated thereon to render the surface hydrophilic. The hydrophilic layer is preferably a layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer having an organic hydrophilic matrix obtained by crosslinking or pseudo-crosslinking an organic hydrophilic polymer described in JP-A-2002-79772, a hydrophilic layer having an inorganic hydrophilic matrix obtained by sol-gel conversion comprising hydrolysis and condensation reaction of polyalkoxysilane, titanate, zirconate or aluminate, of a hydrophilic layer comprising an inorganic thin film having a surface containing a metal oxide. In particular, a hydrophilic layer formed by coating a coating solution containing a colloid of oxide or hydroxide of silicon is more preferred.

In the case of using polyester film or the like as the support of the present invention, an antistatic layer is preferably provided on the hydrophilic layer side or opposite side of the support or on both sides. When an antistatic layer is provided between the support and the hydrophilic layer, this contributes to the enhancement of adhesion to the hydrophilic layer. Examples of the antistatic layer which can be used include a polymer layer having dispersed therein metal oxide fine particles or a matting agent described in JP-A-2002-79772.

The support preferably has a center line average roughness of 0.10 to 1.2 μm. Within this range, good adhesion to the image recording layer, good press life and good antiscumming property can be obtained.

The color density of the support is preferably from 0.15 to 0.65 in terms of the reflection density value. Within this range, good image-forming property by virtue of antibalation at the image exposure and good suitability for plate inspection after development can be obtained.

(Undercoat Layer)

In the lithographic printing plate precursor of the present invention, an undercoat layer comprising a compound having a polymerizable group is preferably provided on the support. When the undercoat layer is used, the image recording layer is provided on the undercoat layer. By virtue of the undercoat layer, in the exposed part, adhesion between the support and the image recording layer is strengthened, whereas in the unexposed part, separation of the image recording layer from the support is facilitated and therefore, the on-press developability is enhanced.

Specific suitable examples of the undercoat layer include a silane coupling agent having an addition-polymerizable ethylenic double bond reactive group described in JP-A-10-282679, and a phosphorus compound having an ethylenic double bond reactive group described in JP-A-2-304441. In addition, a compound having a polymerizable group such as methacryl group and allyl group, and a support-adsorbing group such as sulfonic acid group, phosphoric acid group and phosphoric acid ester, and preferably further having a hydrophilicity-imparting group such as ethylene oxide group is also suitably used.

The coated amount (solid content) of the undercoat layer is preferably from 0.1 to 100 mg/$m^2$, more preferably from 1 to 30 mg/$m^2$.

(Backcoat Layer)

After the support is surface-treated or the undercoat layer is formed, a backcoat may be provided on the back surface of the support, if desired.

Suitable examples of the backcoat include a coat layer comprising a metal oxide obtained by hydrolyzing and polycondensing an organic polymer compound described in JP-A-5-45885 or an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

(Protective Layer)

In the lithographic printing plate precursor of the present invention for use in the lithographic printing method of the present invention, a protective layer may be provided on the image recording layer, if desired, for the purpose of preventing generation of scratches or the like on the image recording layer, blocking oxygen or preventing ablation at the exposure with a high-intensity laser.

In the present invention, the exposure is usually performed in air and the protective layer prevents low molecular compounds such as oxygen and basic substance present in air, which inhibit an image-forming reaction occurring upon exposure in the image recording layer, from mixing into the image recording layer and thereby prevents the inhibition of image-forming reaction at the exposure in air. Accordingly, the property required of the protective layer is low permeability to low molecular compounds such as oxygen. Furthermore, the protective layer is preferably assured of good transparency to light used for exposure, excellent adhesion to the image recording layer, and easy removability during on-press development after exposure. Various studies have been heretofore made on the protective layer having these properties and such protective layers are described in detail, for example, in U.S. Pat. No. 3,458,311 and JP-B-55-49729.

Examples of the material used for the protective layer include a water-soluble polymer compound having relatively excellent crystallinity. Specific examples thereof include a water-soluble polymer such as polyvinyl alcohol, polyvinylpyrrolidone, acidic celluloses, gelatin, gum arabic and polyacrylic acid. In particular, when polyvinyl alcohol (PVA) is used as the main component, most excellent results are obtained with respect to basic properties such as oxygen-blocking property and development removability. A part of the polyvinyl alcohol may be replaced by an ester, an ether or an acetal or may have another copolymerization component as long as the polyvinyl alcohol contains an unsubstituted vinyl alcohol unit for giving necessary oxygen-blocking property and water solubility to the protective layer.

Examples of the polyvinyl alcohol which can be suitably used include those having a hydrolysis degree of 71 to 100% and a polymerization degree of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-2171E, PVA-217E, PVA-220E, PVA-224E, PVA-405, PVA-420, PVA-613 and L-8 produced by Kuraray Co., Ltd.

The components (for example, selection of PVA and use of additives), coated amount and the like of the protective layer are appropriately selected by taking account of fogging, adhesion, scratch resistance and the like in addition to the oxygen-blocking property and development removability. In general, as the PVA has a higher percentage of hydrolysis (namely, as the unsubstituted vinyl alcohol unit content in the protective layer is higher) or as the layer thickness is larger, the oxygen-blocking property is enhanced and this is preferred in view of sensitivity. Also, in order to prevent the occurrence of unnecessary polymerization reaction during production or storage or prevent unnecessary fogging or thickening or the like of the image line at the image exposure, excessively high oxygen permeability is not preferred. Accordingly, the oxygen permeability A at 25° C. under 1 atm is preferably $0.2 \leqq A \leqq 20$ (ml/$m^2$·day).

As other components of the protective layer, glycerin, dipropylene glycol or the like may be added in an amount corresponding to several weight % based on the (co)polymer so as to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in an amount of several weight % based on the (co)polymer.

The adhesion to the image part, scratch resistance and the like of the protective layer are also very important in view of handling of the lithographic printing plate precursor. More specifically, when a protective layer which is hydrophilic by containing a water-soluble polymer compound is stacked on the image recording layer which is lipophilic, the protective layer is readily separated due to insufficient adhesive strength and in the separated portion, defects such as curing failure ascribable to polymerization inhibition by oxygen may be caused.

In order to solve this problem, various proposals have been made with an attempt to improve the adhesive property between the image recording layer and the protective layer. For example, JP-A-49-70702 and Unexamined British Patent Publication No. 1,303,578 describe a technique of mixing from 20 to 60 weight % of an acrylic emulsion, a water-insoluble vinylpyrrolidone-vinyl acetate copolymer or the like in a hydrophilic polymer mainly comprising polyvinyl alcohol and stacking the resulting solution on the image recording layer, thereby obtaining sufficiently high adhesive property. In the present invention, these known techniques all can be used.

Furthermore, other functions may be imparted to the protective layer. For example, when a coloring agent (for example, water-soluble dye) excellent in the transparency to light used for exposure and capable of efficiently absorbing light at other wavelengths is added, the aptitude for safelight can be enhanced without causing decrease in the sensitivity.

The thickness of the protective layer is suitably from 0.1 to 5 μm, preferably from 0.2 to 2 μm.

The method for coating the protective layer is described in detail, for example, in U.S. Pat. No. 3,458,311 and JP-B-55-49729.

EXAMPLES

The present invention is described in greater detail below by referring to Examples, but the present invention should not be construed as being limited thereto.

1. Production of Lithographic Printing Plate Precursor (1) Production of Lithographic Printing Plate Precursor (1)

(Preparation of Support)

A 0.3 mm-thick aluminum plate (construction material: 1050) was degreased with an aqueous 10 weight % sodium aluminate solution at 50° C. for 30 seconds to remove the rolling oil on the surface. Thereafter, the aluminum plate surface was grained by using three nylon brushes implanted with bundled bristles having a diameter of 0.3 mm and a water suspension (specific gravity: 1.1 g/cm$^3$) of pumice having a median diameter of 25 μm, and then thoroughly washed with water. This plate was etched by dipping it in an aqueous 25 weight % sodium hydroxide solution at 45° C. for 9 seconds and after washing with water, dipped in 20 weight % nitric acid at 60° C. for 20 seconds, followed by washing with water. At this time, the etched amount of the grained surface was about 3 g/m$^2$.

Subsequently, the aluminum plate was subjected to a continuous electrochemical surface-roughening treatment by using AC voltage at 60 Hz. The electrolytic solution used here was an aqueous 1 weight % nitric acid solution (containing 0.5 weight % of aluminum ion) at a liquid temperature of 50° C. This electrochemical surface-roughening treatment was performed by using an AC power source of giving a rectangular wave AC having a trapezoidal waveform such that the time TP necessary for the current value to reach the peak from zero was 0.8 msec and the duty ratio was 1:1, and disposing a carbon electrode as the counter electrode. The auxiliary anode was ferrite. The current density was 30 A/dm$^2$ in terms of the peak value of current, and 5% of the current flowing from the power source was split to the auxiliary anode. The quantity of electricity at the nitric acid electrolysis was 175 C/dm$^2$ when the aluminum plate was serving as the anode Thereafter, the aluminum plate was water-washed by spraying.

Thereafter, the aluminum plate was subjected to an electrochemical surface-roughening treatment in the same manner as in the nitric acid electrolysis above by using, as the electrolytic solution, an aqueous 0.5 weight % hydrochloric acid solution (containing 0.5 weight % of aluminum ion) at a liquid temperature of 50° C. under the conditions that the quantity of electricity was 50 C/dm$^2$ when the aluminum plate was serving as the anode, and then water-washed by spraying. This plate was treated in 15 weight % sulfuric acid (containing 0.5 weight % of aluminum ion) as the electrolytic solution at a current density of 15 A/dm$^2$ to provide a DC anodic oxide film of 2.5 g/m$^2$, then washed with water and dried.

Subsequently, the plate was treated in an aqueous 2.5 weight % sodium silicate solution at 30° C. for 10 seconds. The center line average roughness (Ra) of this substrate was measured by using a needle having a diameter of 2 μm and found to be 0.51 μm.

Furthermore, Undercoat Solution (1) having the following composition was coated to have a dry coated amount of 10 mg/m$^2$, thereby preparing a support for use in tests.

Undercoat Solution (1):

| | |
|---|---|
| Undercoat Compound (1) shown below | 0.017 g |
| Methanol | 9.00 g |
| Water | 1.00 g |

Undercoat Compound (1):

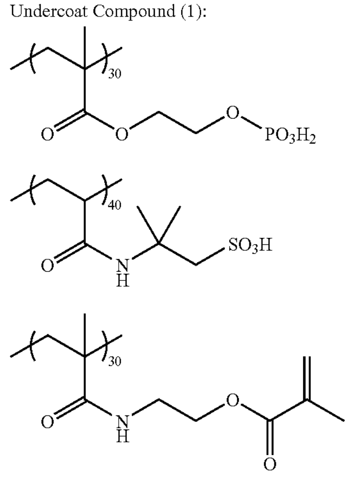

(Formation of Image Recording Layer)

On the support prepared above, Coating Solution (1) for image recording layer having the following composition was bar-coated and dried in an oven at 100° C. for 60 seconds to form an image recording layer having a dry coated amount of 1.0 g/m$^2$.

Coating Solution (1) for image recording layer was obtained by mixing and stirring Photosensitive Solution (1) and Microcapsule Solution (1) shown below immediately before coating.

Photosensitive Solution (1):

| | |
|---|---|
| Binder Polymer (1) shown below | 0.162 g |
| Polymerization Initiator (1) shown below | 0.1 g |
| Infrared Absorbing Dye (1) shown below | 0.020 g |
| Polymerizable compound (Aronics M215, produced by Toa Gosei Co., Ltd.) | 0.385 g |

-continued

| | |
|---|---|
| Fluorine-Containing Surfactant (1) shown below | 0.044 g |
| Methyl ethyl ketone | 1.091 g |
| 1-Methoxy-2-propanol | 8.609 g |
| Microcapsule Solution (1): | |
| Microcapsule (1) synthesized as follows | 2.640 g |
| Water | 2.425 g |

Binder Polymer (1):

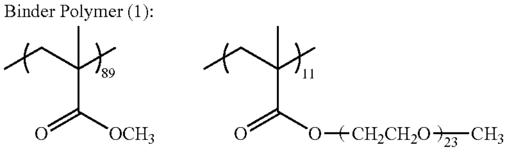

Polymerization Initiator (1):

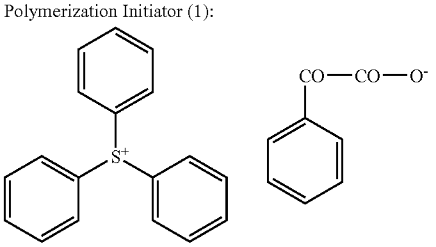

Infrared Absorbent (1):

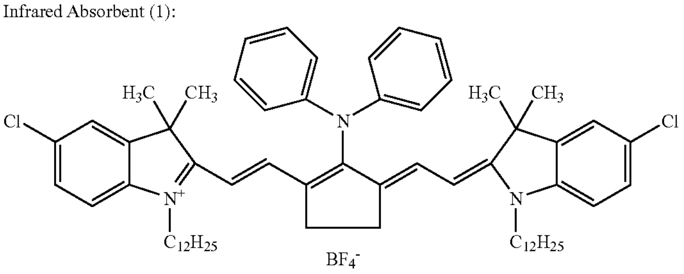

Fluorine-Containing Surfactant (1):

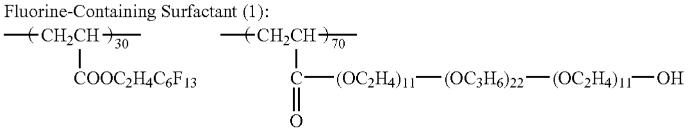

(Synthesis of Microcapsule (1))

As the oil phase component, 10 g of a trimethylolpropane and xylene diisocyanate adduct (Takenate D-110N, produced by Mitsui Takeda Chemicals, Inc.), 6.00 g of Aronics M-215 (produced by Toa Gosei Co., Ltd.) and 0.12 g of Pionin A-41C (produced by Takemoto Yushi Co., Ltd.) were dissolved in 16.67 g of ethyl acetate. As the aqueous phase component, 37.5 g of an aqueous 4 weight % d PVA-205 solution was prepared. The oil phase component and the aqueous phase component were mixed and emulsified in a homogenizer at 12,000 rpm for 10 minutes. Thereafter, 25 g of distilled water was added to the resulting emulsified product and the mixture was stirred at room temperature for 30 minutes and then stirred at 40° C. for 2 hours. The thus-obtained microcapsule solution was diluted with distilled water to a solid content concentration of 15 weight %. The average particle diameter was 0.2 μm.

(Formation of Protective Layer)

A coating solution for protective layer having the following composition was further bar-coated on the image recording layer and then dried in an oven at 125° C. for 75 seconds to form a protective layer in a dry coated amount of 0.1 mg/$m^2$, thereby obtaining Lithographic Printing Plate Precursor (1) for use in Examples 1 to 9 and Comparative Examples 1 to 5.

Coating Solution for Protective Layer:

| | |
|---|---|
| Polyvinyl alcohol (Poval PVA105) (produced by Kuraray Co., Ltd., saponification degree: 98 to 99 mol %, polymerization degree: 500) | 0.895 g |
| Polyvinylpyrrolidone (K30) (produced by Wako Pure Chemical Ind., Ltd., weight average molecular weight: 400,000) | 0.035 g |
| Polyvinylpyrrolidone copolymer (Rubiscol VA64W) (produced by BASF Japan Co., weight average molecular weight: 34,000, a vinylpyrrolidone/vinyl acetate (60/40 by mol) copolymer, a 50 weight % aqueous solution) | 0.048 g |
| Nonionic surfactant (Emalex 710, trade name, produced by Nihon Emulsion Co., Ltd.) | 0.020 g |
| Water | 15.200 g |

(2) Production of Lithographic Printing Plate Precursor (2)

Lithographic Printing Plate Precursor (2) for use in Examples 10 to 13 was obtained in the same manner as Lithographic Printing Plate Precursor (1) except for changing Coating Solution (1) for image recording layer to Coating Solution (2) for image recording layer having the following composition in the production of Lithographic Printing Plate Precursor (1).

Coating Solution (2) for Image Recording Layer:

| | |
|---|---|
| Infrared Absorbent (2) shown below | 0.05 g |
| Polymerization Initiator (1) | 0.1 g |
| Binder Polymer (2) shown below | 0.50 g |
| Polymerizable compound, Aronics M-215 (produced by Toa Gosei Co., Ltd.) | 1.00 g |
| Naphthalenesulfonate of Victoria Pure Blue | 0.02 g |
| Fluorine-Containing Surfactant (1) | 0.044 g |
| Methyl ethyl ketone | 18.0 g |

Infrared Absorbent (2):

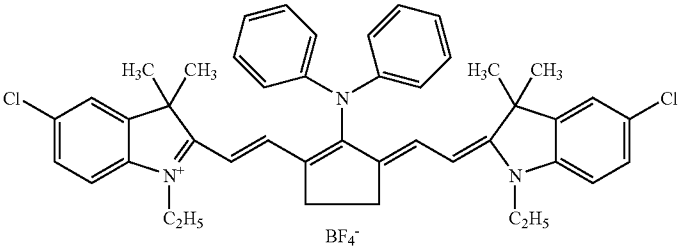

Binder Polymer (2):

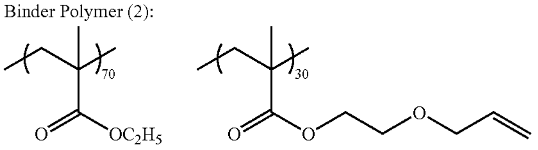

(3) Production of Lithographic Printing Plate Precursor (3)

Lithographic Printing Plate Precursor (3) for use in Examples 14 to 17 was obtained in the same manner as Lithographic Printing Plate Precursor (1) except for changing Coating Solution (1) for image recording layer to Coating Solution (3) for image recording layer having the following composition in the production of Lithographic Printing Plate Precursor (1).

Coating Solution (3) for image recording layer was obtained by mixing Photosensitive Solution (2) and Microcapsule Solution (2) shown below immediately before coating.

Photosensitive Solution (2):

| | |
|---|---|
| Polymerization Initiator (1) | 0.1 g |
| Sensitizer (1) shown below | 1.00 g |
| Binder Polymer (2) | 3.00 g |
| Polymerizable compound, Aronics M-315 (produced by Toa Gosei Co., Ltd.) | 6.20 g |
| Leuco Crystal Violet | 3.00 g |
| Thermopolymerization Inhibitor (N-nitrosophenylhydroxylamine aluminum salt) | 0.10 g |
| Fluorine-Containing Surfactant (1) | 0.044 g |
| Methyl ethyl ketone | 35.00 g |
| 1-Methoxy-2-propanol | 35.00 g |

Microcapsule Solution (2):

| | |
|---|---|
| Microcapsule (2) synthesized as follows | 10.00 g |
| Water | 10.00 g |

Sensitizer (1):

-continued

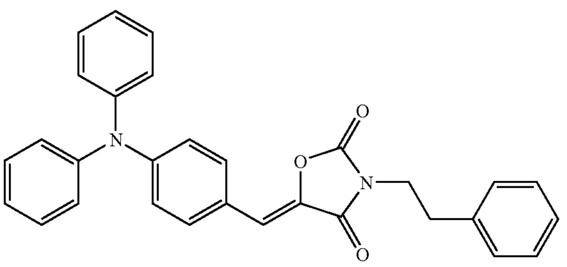

(Synthesis of Microcapsule (2))

As the oil phase component, 10 g of a trimethylolpropane and xylene diisocyanate adduct Takenate D-110N, produced by Mitsui Takeda Chemicals, Inc.), 3.15 g of pentaerythritol triacrylate (SR444, produced by Nippon Kayaku Co., Ltd.), 1 g of 3-(N,N-diethylamino)-6-methyl-7-anilinofluorane (ODB, produced by Yamamoto Chemicals, Inc.), and 0.1 g of Pionin A-41C (produced by Takemoto Yushi Co., Ltd.) were dissolved in 17 g of ethyl acetate, As the aqueous phase component, 40 g of an aqueous 4 weight % PVA-205 solution was prepared. The oil phase component and the aqueous phase component were mixed and emulsified in a homogenizer at 12,000 rpm for 10 minutes. Thereafter, 25 g of distilled water was added to the resulting emulsified product and the mixture was stirred at room temperature for 30 minutes and then stirred at 40° C. for 3 hours. The thus-obtained microcapsule solution was diluted with distilled water to a solid content concentration of 20 weight %. The average particle diameter was 0.25 μm.

2. Preparation of Fountain Solution Composition

According to the formulation in Table 1 below, Fountain Solution Compositions 1 to 9 of the present invention and Fountain Solution Compositions 10 to 13 for comparison were prepared. In the Table, the unit is gram and water was added to finally make 1,000 ml. These compositions all were a concentrated type and diluted on use.

TABLE 1

| | 1 | 2 | 3 | 4 | 5 | 6 | 7 | 8 | 9 | 10 | 11 | 12 | 13 |
|---|---|---|---|---|---|---|---|---|---|---|---|---|---|
| [Compound of Formula (I)] (n/EO:PO ratio*/molecular weight) | | | | | | | | | | | | | |
| 0/25.75/300 | — | — | — | — | — | — | — | — | — | 50 | — | — | — |
| 0/25.75/1000 | 50 | 50 | 50 | — | 50 | 50 | — | — | — | — | — | — | — |
| 0/60.40/1000 | — | — | — | 50 | — | — | — | — | — | — | — | — | — |
| 0/25.75/2000 | — | — | — | — | — | — | — | — | — | — | 50 | — | — |
| 1/25.75/1000 | — | — | — | — | — | — | 50 | — | — | — | — | — | — |
| 1/60.40/1000 | — | — | — | — | — | — | — | 50 | — | — | — | — | — |
| 2/25.75/1000 | — | — | — | — | — | — | — | — | 50 | — | — | — | — |
| [EO- and/or PO-Containing compound other the above] | | | | | | | | | | | | | |
| Pluronic L43 (produced by BASF) | — | — | — | — | — | — | — | — | — | — | — | 50 | — |
| EMALEX 710 | — | — | — | — | — | — | — | — | — | — | — | — | 50 |
| [Water-soluble polymer compound] | | | | | | | | | | | | | |
| Polyvinylpyrrolidone K-15 | 40 | 40 | — | — | — | — | 40 | 40 | 40 | 40 | 40 | 40 | — |
| Polyvinylpyrrolidone K-30 | — | — | 40 | 40 | — | — | — | — | — | — | — | — | 40 |
| Hydroxypropyl cellulose | — | — | — | — | — | 40 | — | — | — | — | — | — | — |
| Carboxymethyl cellulose | — | 40 | — | — | 40 | — | 40 | 40 | 40 | — | 40 | — | — |
| [Saccharides and glycerin] | | | | | | | | | | | | | |
| Glucose | 50 | — | — | — | — | — | — | — | — | 50 | — | 50 | — |
| Sorbitol | — | 100 | — | — | 100 | — | 100 | 100 | 100 | — | 100 | — | 100 |
| Saccharose | — | — | 50 | 50 | — | 50 | — | — | — | — | — | — | — |
| Maltitol | 50 | — | — | — | — | — | — | — | — | 50 | — | 50 | — |
| Glycerin | — | — | 50 | 50 | — | 50 | — | — | — | — | — | — | — |
| [pH Adjusting Agent] | | | | | | | | | | | | | |
| Gluconic acid | 10 | 10 | 10 | 10 | 10 | 10 | 10 | 10 | 10 | 10 | 10 | 10 | 10 |
| Primary ammonium citrate | 10 | 10 | 10 | 10 | 10 | 10 | 10 | 10 | 10 | 10 | 10 | 10 | 10 |
| Primary ammonium phosphate | 5 | 5 | 5 | 5 | 5 | 5 | 5 | 5 | 5 | 5 | 5 | 5 | 5 |
| Ammonium nitrate | 10 | 10 | 10 | 10 | 10 | 10 | 10 | 10 | 10 | 10 | 10 | 10 | 10 |
| [Antiseptic] | | | | | | | | | | | | | |
| 4-Isothiazolin-3-one derivative | 4 | 4 | 4 | 4 | 4 | 4 | 4 | 4 | 4 | 4 | 4 | 4 | 4 |
| Pure water | to make 1,000 ml in total | | | | | | | | | | | | |

EO:PO Ratio*: Ratio of addition molar numbers of ethylene oxide and propylene oxide The thus-prepared Fountain Solution Compositions 1 to 13 each was 40-fold diluted with a quasi-bard water having a hardness of 2,000 ppm and adjusted to a pH of 4.8 to 5.3 by using NaOH and phosphoric acid (85 weight %) to obtain a fountain solution actually used.

Furthermore, 8 weight % of isopropyl alcohol and 1 weight % of Fountain Solution EU-3 produced by Fuji Photo Film Co., Ltd. were added to the quasi-hard water having a hardness of 2,000 ppm to produce Fountain Solution 14 as a solution on use.

<Composition of Quasi-Hard Water>

| | |
|---|---|
| $CaCl_2 \cdot 2H_2O$ | 24.5 g |
| $MgSo_4 \cdot 7H_2O$ | 7.3 g |
| Aqueous 1N-NaOH solution | 2.0 g |
| Pure water | 8,866.2 g |

Examples 1 to 17 and Comparative Examples 1 to 5

Exposure, on-press development and printing were performed by using the thus-obtained lithographic printing plate precursor and fountain solution in the combination shown in Table 2, and the on-press developability and the attachment of developed/removed components on the ink roller and the watering roller were evaluated as follows.

(1) On-Press Developability

Lithographic Printing Plate Precursors (1) and (2) obtained above each was exposed by using Trendsetter 3244VX (manufactured by Creo) having mounted thereon a water-cooling 40 W infrared semiconductor laser, under the conditions that the output was 9 W, the rotation number of outer drum was 210 rpm and the resolution was 2,400 dpi. The exposure image was prepared to contain a fine line chart. Also, Lithographic Printing Plate Precursor (3) was exposed by a semiconductor laser of 375 nm under the conditions that the output was 2 mW, the peripheral length of outer drum was 900 nm, the rotation number of drum was 800 rpm and the resolution was 2,400 dpi. The exposure image used here was also prepared to contain a fine line chart.

The resulting exposed lithographic printing plate was, without passing through development processing, loaded on a cylinder of a printing press, SOR-M, manufactured by Heidelberg and after supplying an ink and a fountain by using the fountain solution shown in Table 2 and TRANS-G(N) Black Ink (produced by Dai-Nippon Ink & Chemicals, Inc.), 100 sheets were printed at a printing speed of 6,000 sheets per hour.

The number of printing sheets required until the on-press development of the image recording layer in the unexposed part on the printing press was completed and the ink was not transferred to the printing sheet was counted and evaluated as the on-press developability. The results are shown in Table 2.

(2) Attachment of Developed/Removed Components on Ink Roller and Watering Roller After the printing above, the ink on the ink roller and watering roller was cleaned with a wash oil by using a normal doctor blade. The remaining of the developed/removed component on each roller after cleaning was observed with an eye and evaluated as the developed/removed component attachment according to the following indices. The results are shown in Table 2 below.

<Evaluation Indices of Developed/Removed Component Attachment>

A: After cleaning with wash oil, absolutely no attachment of developed/removed components.

B: After cleaning with wash oil, the attached components slightly remained but could be removed by cleaning with ABC Safety Blanket Roller Cleaner (produced by Openshaw Limited), and OK level.

C: After cleaning with ABC Safety Blanket Roller Cleaner, the attached components slightly remained, and NO level.

D: Evan after cleaning with ABC Safety Blanket Roller Cleaner, the attached components remained in a large amount.

TABLE 2

| Example | Lithographic Printing Plate Precursor | Fountain Solution Composition | On-Press Developability [sheets] | Attachment of Developed/ Removed Components on Ink Roller and Watering Roller |
|---|---|---|---|---|
| Example 1 | (1) | 1 | 15 | A |
| Example 2 | | 2 | 15 | A |
| Example 3 | | 3 | 15 | A |
| Example 4 | | 4 | 20 | A |
| Example 5 | | 5 | 15 | A |
| Example 6 | | 6 | 15 | A |
| Example 7 | | 7 | 20 | A |
| Example 8 | | 8 | 25 | B |
| Example 9 | | 9 | 20 | A |
| Example 10 | (2) | 3 | 20 | A |
| Example 11 | | 4 | 25 | B |
| Example 12 | | 7 | 25 | B |
| Example 13 | | 8 | 25 | B |
| Example 14 | (3) | 3 | 15 | A |
| Example 15 | | 4 | 20 | A |
| Example 16 | | 7 | 20 | A |
| Example 17 | | 8 | 20 | A |
| Comparative Example 1 | (1) | 10 | 65 | C |
| Comparative Example 2 | | 11 | 70 | C |
| Comparative Example 3 | | 12 | 120 | D |
| Comparative Example 4 | | 13 | 110 | D |
| Comparative Example 5 | | 14 | 150 | D |

As apparent from Table 2, according to the lithographic printing method of the present invention (Examples 1 to 17), the on-press developability becomes very excellent and the attachment of developed/removed components on the ink roller and watering roller after solvent washing is remarkably improved. Furthermore, since Fountain Solution Compositions 1 to 9 used in Examples 1 to 17 contain no isopropyl alcohol, these are completely free of a problem in view of work safety and fire protection and moreover, can be suppressed in the amount of volatile organic solvent and this is very preferred also from the environmental standpoint.

Example 18

A lithographic printing plate precursor was produced, used for printing and evaluated in the same manner as in Example 1 except for using the following Microgel Solution (1) in place of Microcapsule Solution (1) in Example 1.

The on-press developability was 15 sheets and the rating of developed/removed component attachment on ink roller and watering roller was A.

Microgel Solution (1);

| | |
|---|---|
| Microgel (1) synthesized as follows | 2.640 g |
| Distilled water | 2.425 g |

(Synthesis of Microgel (1))

As the oil phase component, 10 g of a trimethylolpropane and xylene diisocyanate adduct Takenate D-110N, produced by Mitsui Takeda Chemicals, Inc.), 3.15 g of pentaerythritol triacrylate (SR444, produced by Nippon Kayaku Co., Ltd.) and 0.1 g of Pionin A-41C (produced by Takemoto Yushi Co., Ltd.) were dissolved in 17 g of ethyl acetate. As the aqueous phase component, 40 g of an aqueous 4 weight % PVA-205 solution was prepared. The oil phase component and the aqueous phase component were mixed and emulsified in a homogenizer at 12,000 rpm for 10 minutes. The resulting emulsified product was added to 25 g of distilled water and the mixture was stirred at room temperature for 30 minutes and then stirred at 50° C. for 3 hours. The thus-obtained microgel solution was diluted with distilled water to a solid content concentration of 15 weight %. The average particle diameter was 0.2 μm.

This application is based on Japanese Patent application JP 2004-296169, filed Oct. 8, 2004, and Japanese Patent application JP 2005-212926, filed Jul. 22, 2005, the entire contents of which are hereby incorporated by reference, the same as if set forth at length.

What is claimed is:

1. A printing method comprising:

imagewise exposing a lithographic printing plate precursor comprising a support and an image recording layer being removable with a fountain solution or a combination of a printing ink and a fountain solution and loading the exposed lithographic printing plate precursor on a plate cylinder of a printing press, or loading a lithographic printing plate precursor comprising a support and an image recording layer being removable with at least one of a printing ink and a fountain solution on a plate cylinder of a printing press and imagewise exposing the loaded lithographic printing plate precursor;

supplying at least a fountain solution comprising a compound represented by the following formula (I) to the exposed lithographic printing plate precursor so as to remove an unexposed area of the image recording layer:

(I)

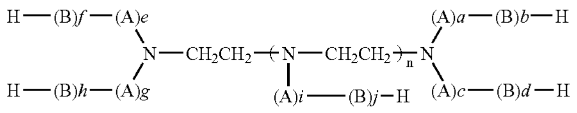

wherein A and B each independently represents $—CH_2CH_2O—$ or $—CH_2CH(CH_3)O—$, and A and B are groups different from each other; a, b, c, d, e, f, g, h, i and j each represents an integer of 1 or more, and a, b, c, d, e, f, g, h, i and j are values given such that the compound represented by the formula (I) has a weight average molecular weight of from 500 to 1,500; and n represents an integer of 1 or more; and performing printing.

2. The printing method according to claim 1, wherein in formula (I), n is 1.

3. The printing method according to claim 1, wherein in the compound represented by the formula (I), a ratio of addition molar numbers of ethylene oxide and propylene oxide is from 5:95 to 50:50.

4. The printing method according to claim 1, wherein the fountain solution further comprises at least one member selected from polyvinylpyrrolidone, saccharides and glycerin.

5. The printing method according to claim 1, wherein the fountain solution comprises substantially no volatile organic solvent.

6. The printing method according to claim 1, wherein the image recording layer comprises an infrared absorbent, a polymerization initiator and a polymerizable compound, and a light source for the exposing is an infrared laser.

7. The printing method according to claim 6, wherein the image recording layer comprises a microcapsule or a microgel.

8. The printing method according to claim 1, wherein the image recording layer comprises a polymerization initiator and a polymerizable compound and has photosensitivity in a wavelength range of from 250 to 420 nm, and a light source for the exposing is an ultraviolet laser.

9. The printing method according to claim 8, wherein the image recording layer comprises a microcapsule or a microgel.

* * * * *